(12) United States Patent
Vuillermet et al.

(10) Patent No.: US 12,352,786 B2
(45) Date of Patent: Jul. 8, 2025

(54) CURRENT SENSOR SYSTEM

(71) Applicant: Allegro MicroSystems, LLC, Manchester, NH (US)

(72) Inventors: Yannick Vuillermet, La Motte Servolex (FR); Rémy Lassalle-Balier, Bures sur Yvette (FR)

(73) Assignee: Allegro MicroSystems, LLC, Manchester, NH (US)

( * ) Notice: Subject to any disclaimer, the term of this patent is extended or adjusted under 35 U.S.C. 154(b) by 139 days.

(21) Appl. No.: 18/300,776

(22) Filed: Apr. 14, 2023

(65) Prior Publication Data

US 2023/0251290 A1 Aug. 10, 2023

Related U.S. Application Data

(63) Continuation-in-part of application No. 17/467,713, filed on Sep. 7, 2021, now Pat. No. 11,656,250.

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01)

(58) Field of Classification Search
CPC .. G01R 15/202; G01R 15/205; G01R 15/207; G01R 19/0092
See application file for complete search history.

(56) References Cited

U.S. PATENT DOCUMENTS

| 4,757,420 A | 7/1988 | Saletta et al. |
| 5,041,780 A * | 8/1991 | Rippel ................. G01R 15/207 324/251 |
| 6,300,617 B1 | 10/2001 | Daughton et al. |
| 6,512,359 B1 * | 1/2003 | Tamai ................. G01R 15/207 324/117 R |

(Continued)

FOREIGN PATENT DOCUMENTS

| CN | 112649645 A | 4/2021 |
| GB | 2547732 14 | 8/2017 |

(Continued)

OTHER PUBLICATIONS

Response to Office Action dated Jul. 5, 2023 for U.S. Appl. No. 17/804,654, filed Sep. 15, 2023, 10 pages.

(Continued)

*Primary Examiner* — Dominic E Hawkins
(74) *Attorney, Agent, or Firm* — Daly, Crowley, Mofford & Durkee, LLP

(57) ABSTRACT

A system, comprising: a printed circuit board; a first conductor having a first central longitudinal axis, the first conductor having a first through-hole that is formed therein; a second conductor having a second central longitudinal axis; and a first current sensor that is mounted on the printed circuit board, the first current sensor being disposed at least partially inside the first through-hole, the first current sensor including a first pair of magnetic field sensing elements, the magnetic field sensing elements in the first pair being aligned with a first alignment axis that is arranged at a first angle relative to the second central longitudinal axis, the first angle being less than 75 degrees.

17 Claims, 31 Drawing Sheets

(56) References Cited

U.S. PATENT DOCUMENTS

| | | |
|---|---|---|
| 6,583,613 B1 | 6/2003 | Hohe et al. |
| 7,476,816 B2 | 1/2009 | Doogue et al. |
| 7,746,056 B2 | 6/2010 | Stauth et al. |
| 7,816,905 B2 | 10/2010 | Doogue et al. |
| 7,923,996 B2 | 4/2011 | Doogue et al. |
| 7,936,164 B2 | 5/2011 | Doogue et al. |
| 8,030,918 B2 | 10/2011 | Doogue et al. |
| 8,447,556 B2 | 5/2013 | Friedrich et al. |
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,818,749 B2 | 8/2014 | Friedrich et al. |
| 8,896,295 B2 | 11/2014 | Friedrich et al. |
| 8,907,669 B2 | 12/2014 | Petrie |
| 9,081,041 B2 | 7/2015 | Friedrich et al. |
| 9,151,807 B2 | 10/2015 | Friedrich et al. |
| 9,201,122 B2 | 12/2015 | Cesaretti et al. |
| 9,557,352 B2* | 1/2017 | Akimoto ............... G01R 15/207 |
| 10,481,181 B2 | 11/2019 | Bussing et al. |
| 10,761,120 B2 | 9/2020 | Feucht et al. |
| 10,884,031 B2 | 1/2021 | Vuillermet et al. |
| 10,908,190 B2 | 2/2021 | Bussing et al. |
| 11,047,884 B2 | 6/2021 | Shimizu |
| 11,150,273 B2 | 10/2021 | Liu et al. |
| 11,226,382 B2 | 1/2022 | Augendre et al. |
| 11,320,466 B1 | 5/2022 | Briano et al. |
| 11,395,402 B2 | 7/2022 | Sutono |
| 11,561,112 B2 | 1/2023 | Briano et al. |
| 12,306,217 B2 | 5/2025 | Houis |
| 2007/0279053 A1 | 12/2007 | Taylor et al. |
| 2008/0231255 A1 | 9/2008 | Lepine et al. |
| 2009/0121704 A1 | 5/2009 | Shibara |
| 2011/0270553 A1 | 11/2011 | Ausserlechner et al. |
| 2012/0001617 A1 | 1/2012 | Reynolds |
| 2012/0112365 A1 | 5/2012 | Ausserlechner et al. |
| 2012/0146164 A1 | 6/2012 | Ausserlechner |
| 2012/0253726 A1 | 10/2012 | Xu |
| 2012/0262152 A1 | 10/2012 | Ausserlechner |
| 2013/0015843 A1 | 1/2013 | Doogue et al. |
| 2013/0135548 A1 | 5/2013 | Burberry et al. |
| 2013/0335076 A1 | 12/2013 | Sakamoto et al. |
| 2014/0111196 A1 | 4/2014 | Sakai et al. |
| 2014/0253103 A1 | 9/2014 | Racz et al. |
| 2014/0266181 A1 | 9/2014 | Milano et al. |
| 2014/0300349 A1* | 10/2014 | Walker ............... G01R 19/0092 |
| | | 324/207.25 |
| 2014/0312883 A1 | 10/2014 | Friedrich et al. |
| 2015/0204916 A1* | 7/2015 | Akimoto ............... G01R 15/207 |
| | | 702/64 |
| 2015/0204919 A1 | 7/2015 | Akimoto et al. |
| 2015/0301149 A1 | 10/2015 | Cesaretti et al. |
| 2015/0323568 A1* | 11/2015 | Schmitt ............... G01R 15/205 |
| | | 324/126 |
| 2015/0331079 A1 | 11/2015 | Kolwalker et al. |
| 2015/0338444 A1 | 11/2015 | Ivanov et al. |
| 2015/0362532 A1 | 12/2015 | Chartouni |
| 2016/0011239 A1 | 1/2016 | Yoon et al. |
| 2016/0223594 A1 | 8/2016 | Suzuki et al. |
| 2016/0274060 A1 | 9/2016 | Deneneberg et al. |
| 2016/0282388 A1 | 9/2016 | Milano et al. |
| 2017/0131329 A1 | 5/2017 | Gorai et al. |
| 2017/0242058 A1 | 8/2017 | Kawanami et al. |
| 2017/0285075 A1 | 10/2017 | Okuyama et al. |
| 2018/0003742 A1 | 1/2018 | Shimizu |
| 2018/0031613 A1 | 1/2018 | Nakayama |
| 2018/0180649 A1* | 6/2018 | Paci ............... G01R 15/205 |
| 2018/0238938 A1 | 8/2018 | Feucht et al. |
| 2018/0321283 A1 | 11/2018 | Sei et al. |
| 2019/0187187 A1 | 6/2019 | Umetsu et al. |
| 2019/0212372 A1 | 7/2019 | De Mendizabal et al. |
| 2019/0391185 A1 | 12/2019 | El Bacha et al. |
| 2020/0011902 A1* | 1/2020 | Shimizu ............... G01R 19/0092 |
| 2020/0057097 A1 | 2/2020 | Vuillermet et al. |
| 2020/0057120 A1 | 2/2020 | Belin et al. |
| 2020/0132725 A1 | 4/2020 | Krummenacher et al. |
| 2020/0300919 A1* | 9/2020 | Song ............... H01M 10/42 |
| 2021/0080489 A1 | 3/2021 | Koizumi |
| 2021/0242353 A1 | 8/2021 | Kim et al. |
| 2021/0311136 A1* | 10/2021 | Augendre .......... G01R 19/0092 |
| 2023/0071087 A1 | 3/2023 | Vuillermet et al. |

FOREIGN PATENT DOCUMENTS

| | | |
|---|---|---|
| KR | 20230001089 | 1/2023 |
| WO | WO 2017/144715 A1 | 8/2017 |

OTHER PUBLICATIONS

Notice of Allowance dated Nov. 8, 2023 for U.S. Appl. No. 17/804,654, 11 pages.
Office Action dated Nov. 28, 2023 for Application No. 17/695,193, 16 pages.
Office Action dated Jul. 5, 2023 for U.S. Appl. No. 17/804,654; 16 pages.
Extended European Search Report dated Sep. 20, 2024 for European Application No. 24166728.6; 10 pages.
U.S. Appl. No. 17/651,080, filed Feb. 15, 2022, Rock, et al.
U.S. Appl. No. 17/695,193, filed Mar. 15, 2022, Messier, et al.
U.S. Appl. No. 17/804,647, filed May 31, 2022, Vuillermet, et al.
U.S. Appl. No. 17/804,654, filed May 31, 2022, Messier, et al.
U.S. Appl. No. 17/850,152, filed Jun. 27, 2022, Vuillermet, et al.
U.S. Appl. No. 17/810,353, filed Jul. 1, 2022, Rock, et al.
Allegro MicroSystems Datasheet "Busbar Geometry And Design Techniques For Coreless Acs37610 Differential Current Sensor", Jan. 6, 2021, 11 pages.
Allegro MicroSystems datasheet "ACS37612 Coreless, High Precision, Hall-Effect Current Sensor IC with Common-Mode Field Rejection and High Bandwidth (240 kHz)", Mar. 9, 2020, 22 pages.
Auto Innovations "L'évolution du moteur électrique passe par une meilleure mesure de la position de son rotor", Oct. 2019, 7 pages.
Infineon Datasheet, "TLE4972-AE35D5 high precision coreless current sensor for automotive applications", Dec. 21, 2021, 20 pages.
Infineon Datasheet, "TLE4972-AE35S5 high precision coreless current sensor for automotive applications", Dec. 21, 2021, 20 pages.
Melexis Inspired Engineering; "Current Sensors Reference Design Guide"; Aug. 2016; 27 Pages.
Extended European Search Report dated Jul. 10, 2018 for EP Application No. 18154879.3; 10 Pages.
Response filed on Feb. 22, 2019 for European Application No. 18154879.3; 20 Pages.
Intention to Grant dated Jun. 7, 2019 for European Application No. 18154879.3; 7 Pages.
Office Action dated Sep. 24, 2019 for U.S. Appl. No. 15/435,725; 25 pages.
Response to Office Action filed on Oct. 18, 2019 for U.S. Appl. No. 15/435,725; 13 pages.
Final Office Action dated Jan. 24, 2020 for U.S. Appl. No. 15/435,725; 25 pages.
Response to Final Office Action and Request for Continued Examination (RCE) filed on Mar. 31, 2020 for U.S. Appl. No. 15/435,725; 14 pages.
Notice of Allowance dated Jun. 9, 2020 for U.S. Appl. No. 15/435,725; 8 pages.
Office Action dated Jul. 6, 2020 for U.S. Appl. No. 15/999,122; 18 pages.
Office Action dated May 11, 2021 for U.S. Appl. No. 16/841,853, 18 pages.
Response to Office Action filed on Jul. 28, 2021 for U.S. Appl. No. 16/841,853, 12 pages.
Notice of Allowance dated Oct. 28, 2021 for U.S. Appl. No. 16/841,853, 9 pages.
PCT Search Report and Written Opinion dated Oct. 31, 2022 for PCT Application No. PCT/US2022/038329; 12 pages.
U.S. Office Action dated Dec. 6, 2022 for U.S. Appl. No. 17/651,080, 18 pages.

(56) References Cited

OTHER PUBLICATIONS

Response to U.S. Office Action dated Dec. 6, 2022, filed on Mar. 6, 2023 for U.S. Appl. No. 17/651,080, 13 pages.
U.S. Office Action dated Sep. 14, 2022 for U.S. Appl. No. 17/467,713; 19 pages.
Response to U.S. Office Action dated Sep. 14, 2022, filed on Nov. 1, 2022 for U.S. Appl. No. 17/467,713; 13 pages.
Notice of Allowance dated Jan. 17, 2023 for U.S. Appl. No. 17/467,713; 11 pages.
U.S. Notice of Allowance dated Jul. 21, 2023 for U.S. Appl. No. 17/651,080; 17 pages.
U.S. Notice of Allowance dated Sep. 13, 2023 for U.S. Appl. No. 17/651,080; 11 pages.
Response to Office Action dated Nov. 28, 2023 filed on Feb. 13, 2024, for U.S. Appl. No. 17/695,193, 7 pages.
Notice of Allowance dated Mar. 7, 2024 for U.S. Appl. No. 17/695,193, 8 pages.
Response to European Search Report dated Sep. 20, 2024 filed on Apr. 7, 2025 for European Application No. 24166728.6, 23 pages.

\* cited by examiner

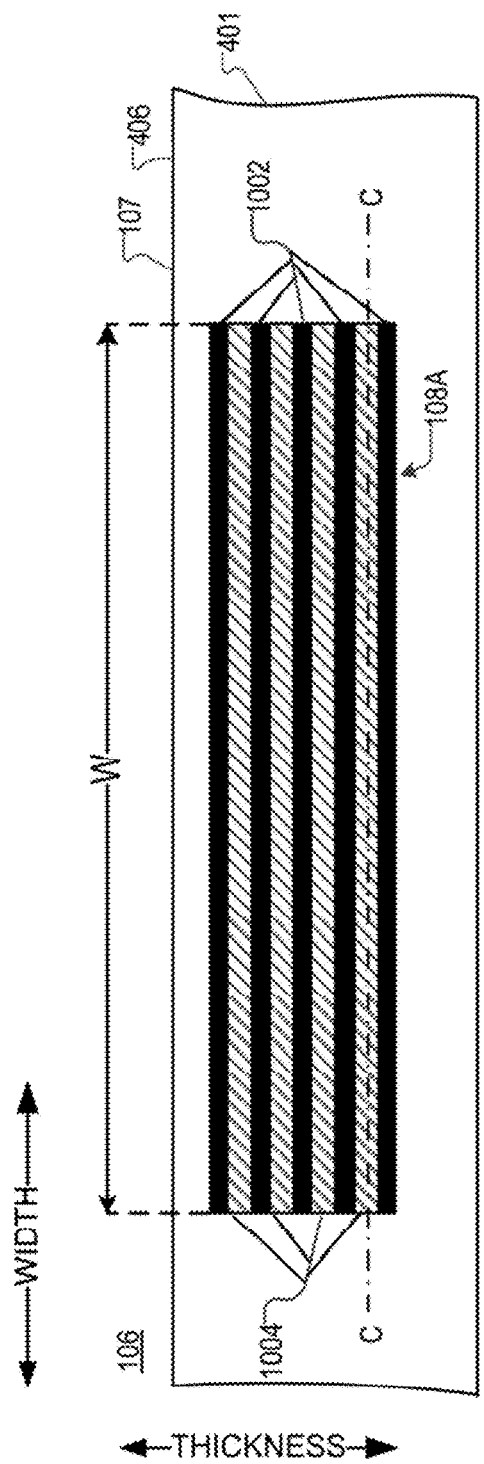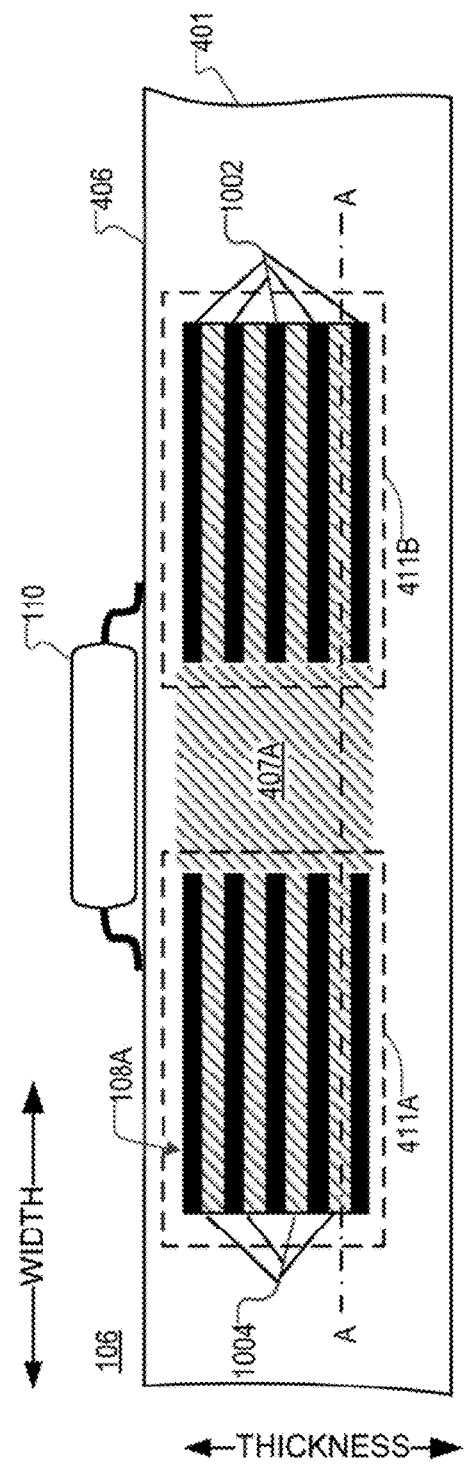
FIG. 10A
FIG. 10B

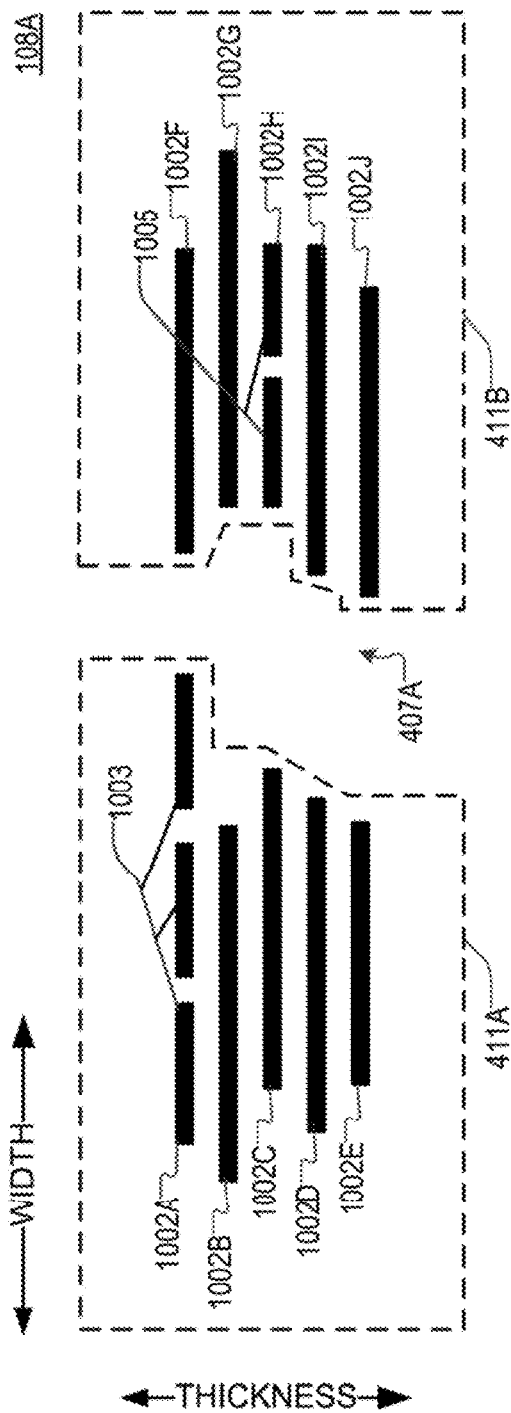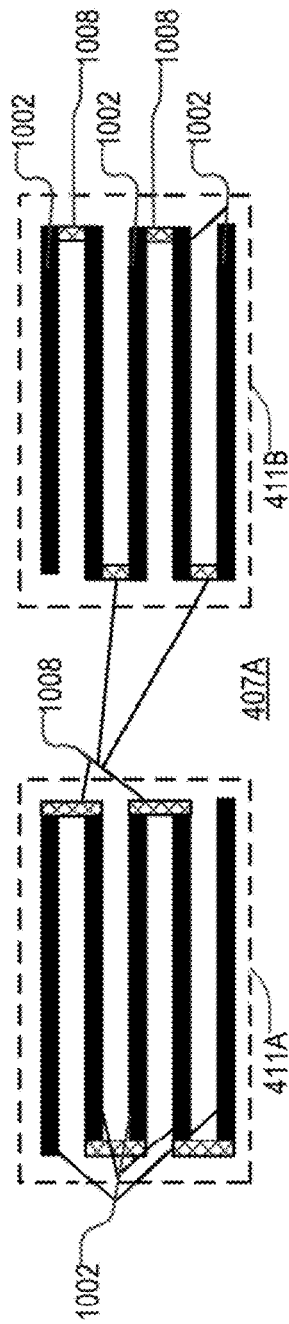
FIG. 10C
FIG. 10D

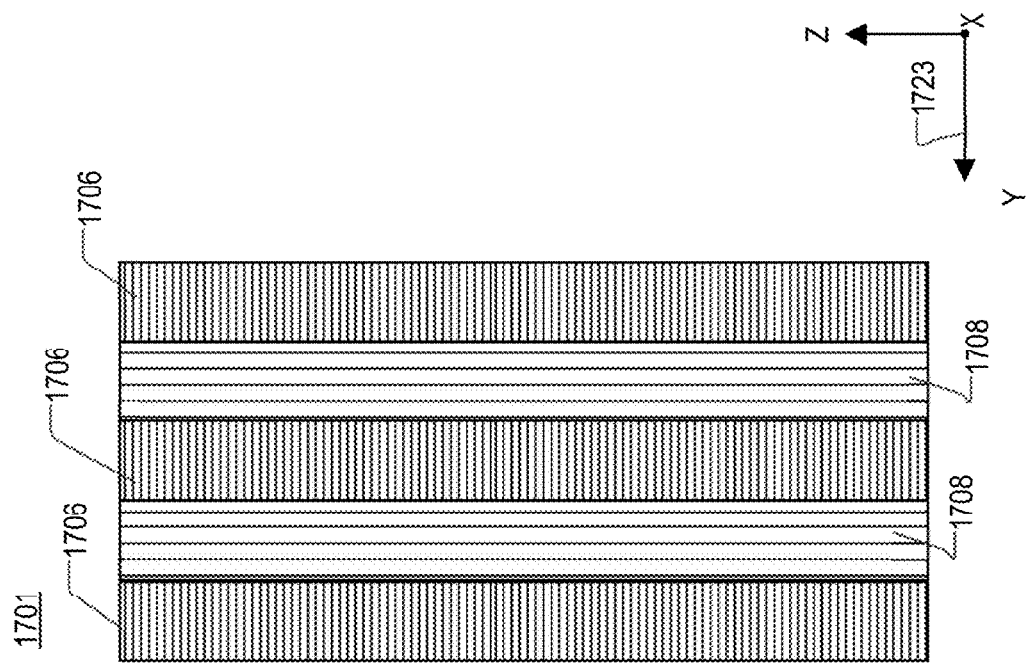
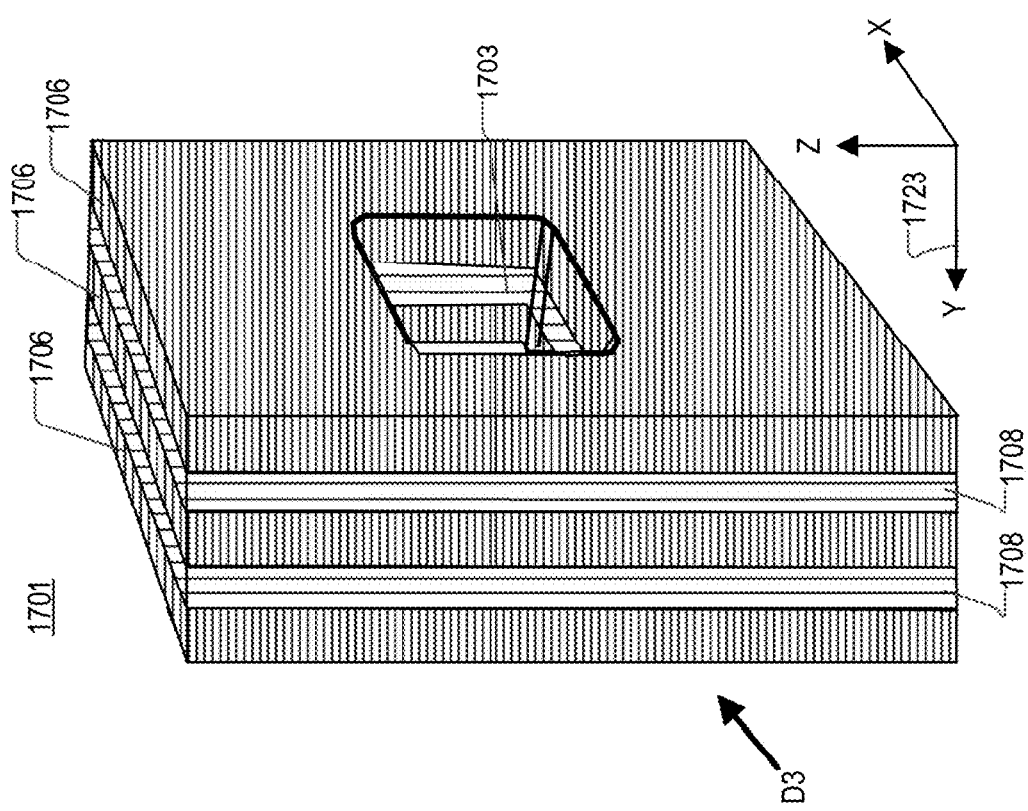

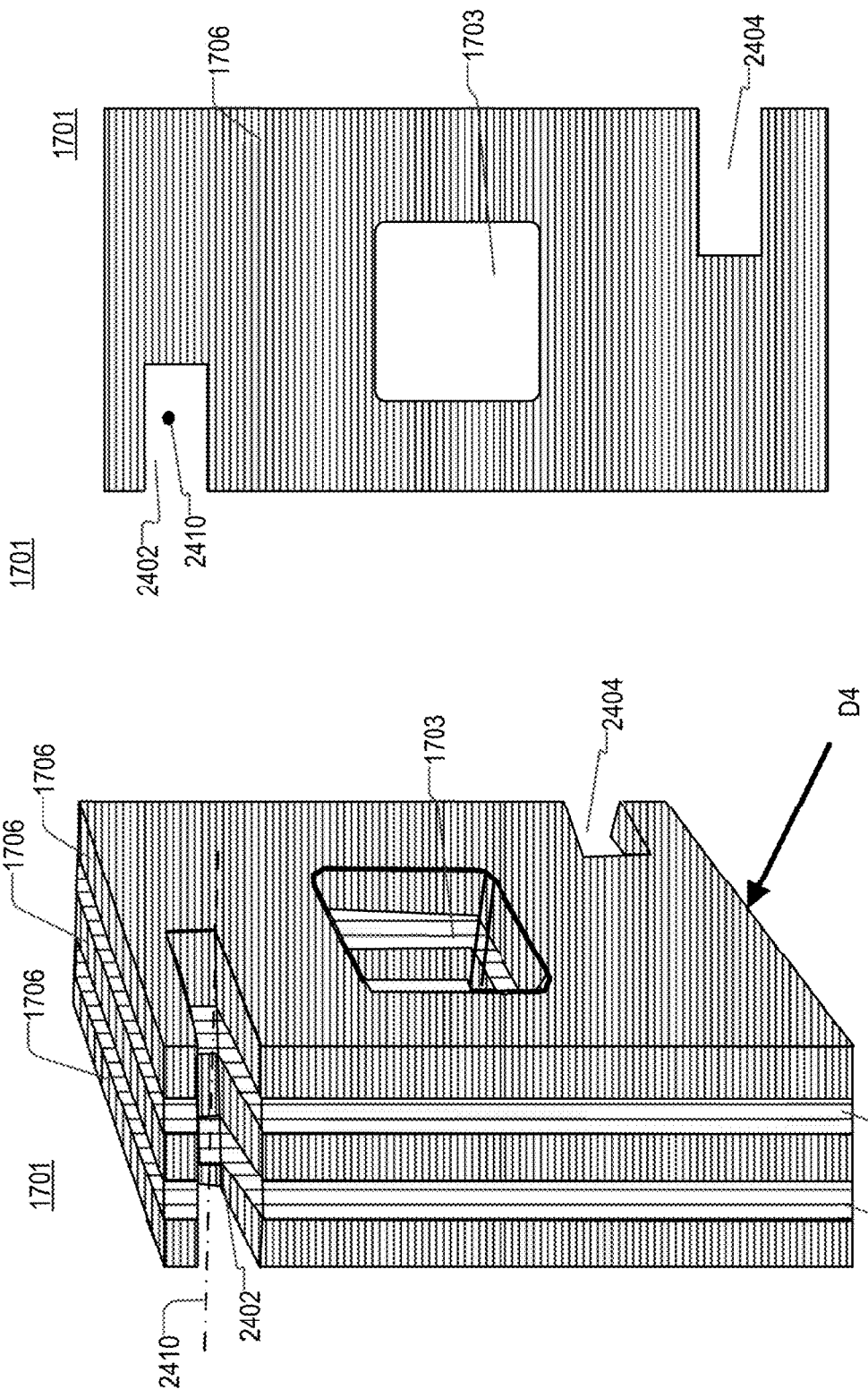

CURRENT SENSOR SYSTEM

CLAIM OF PRIORITY

The present application is filed as a Continuation-in-Part application of U.S. application Ser. No. 17/467,713, filed on Sep. 7, 2021, and entitled: Current Sensor System, which is herein incorporated by reference in its entirety.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a system is provided, comprising: a printed circuit board; a first conductor having a first central longitudinal axis, the first conductor having a first through-hole that is formed therein; a second conductor having a second central longitudinal axis; and a first current sensor that is mounted on the printed circuit board, the first current sensor being disposed at least partially inside the first through-hole, the first current sensor including a first pair of magnetic field sensing elements, the magnetic field sensing elements in the first pair being aligned with a first alignment axis that is arranged at a first angle relative to the second central longitudinal axis, the first angle being less than 75 degrees.

According to aspects of the disclosure, a system is provided, comprising: a printed circuit board; a first conductor having a first central longitudinal axis, the first conductor having a first through-hole that is formed therein; a second conductor having a second central longitudinal axis; and a first current sensor that is mounted on the printed circuit board, the first current sensor being disposed at least partially inside the first through-hole, the first current sensor including a first pair of magnetic field sensing elements, the magnetic field sensing elements in the first pair being aligned with a first alignment axis that is substantially parallel to the second central longitudinal axis.

According to aspects of the disclosure, a system is provided, comprising: a printed circuit board; a first conductor having a first central longitudinal axis, the first conductor having a first notch and a second notch; a second conductor having a second central longitudinal axis; and a first current sensor that is mounted on the printed circuit board, the first current sensor being disposed at least partially inside the first notch, the first current sensor including a first pair of magnetic field sensing elements, the magnetic field sensing elements in the first pair being aligned with a first alignment axis.

According to aspects of the disclosure, a system is provided, comprising: a first conductor having a first central longitudinal axis, the first conductor having a first through-hole that is formed therein; a second conductor that is disposed adjacent to the first conductor, the first conductor having a second central longitudinal axis, the second conductor having a second through-hole that is formed therein; a printed circuit board that is inserted through the first through-hole and the second through-hole, the printed circuit board having a first current sensor and a second current sensor mounted thereon, wherein, the first current sensor is disposed inside the first through-hole and includes a first pair of magnetic field sensing elements, the magnetic field sensing elements in the first pair having respective axes of maximum sensitivity that are substantially perpendicular to the first central longitudinal axis, and wherein, the second current sensor is disposed inside the second through-hole and includes a second pair of magnetic field sensing elements, the magnetic field sensing elements in the second pair having respective axes of maximum sensitivity that are substantially perpendicular to the second central longitudinal axis.

According to aspects of the disclosure, a system is provided, comprising: a printed circuit board; a conductor having a pair of notches formed therein that define a mid-portion of the conductor, the mid portion being disposed between a first end portion and a second end portion of the conductor, the mid portion extending along an axis Q-Q that is arrented at a first angle relative to a central longitudinal axis A3-A3, the first angle being less than 75 degrees; a current sensor that is mounted on the printed circuit board, the current sensor being disposed at least partially inside the through-hole, the current sensor including a pair of magnetic field sensing elements that are aligned with an axis G-G, the axis G-G being arranged at a second angle relative to the central longitudinal axis A3-A3, the second angle being less than 75 degrees.

BRIEF DESCRIPTION OF THE DRAWINGS

The foregoing features may be more fully understood from the following description of the drawings in which:

FIG. 10A is a diagram of an example of a conductor, according to aspects of the disclosure;

FIG. 10B is a diagram illustrating the use of the conductor of FIG. 10A, according to aspects of the disclosure;

FIG. 10C is a diagram illustrating an alternative configuration of the conductor of FIG. 10A, according to aspects of the disclosure; and FIG. 10D is a diagram illustrating an alternative configuration of the conductor of FIG. 10A, according to aspects of the disclosure.

FIG. 21A is a perspective view of a conductor assembly, according to aspects of the disclosure;

FIG. 21B is planar side view of the conductor assembly of FIG. 21A, according to aspects of the disclosure;

FIG. 24A is a perspective view of an example of a conductor assembly, according to aspects of the disclosure; and FIG. 24B is a planar side view of an example of a conductor assembly, according to aspects of the disclosure.

DETAILED DESCRIPTION

Figure 1:
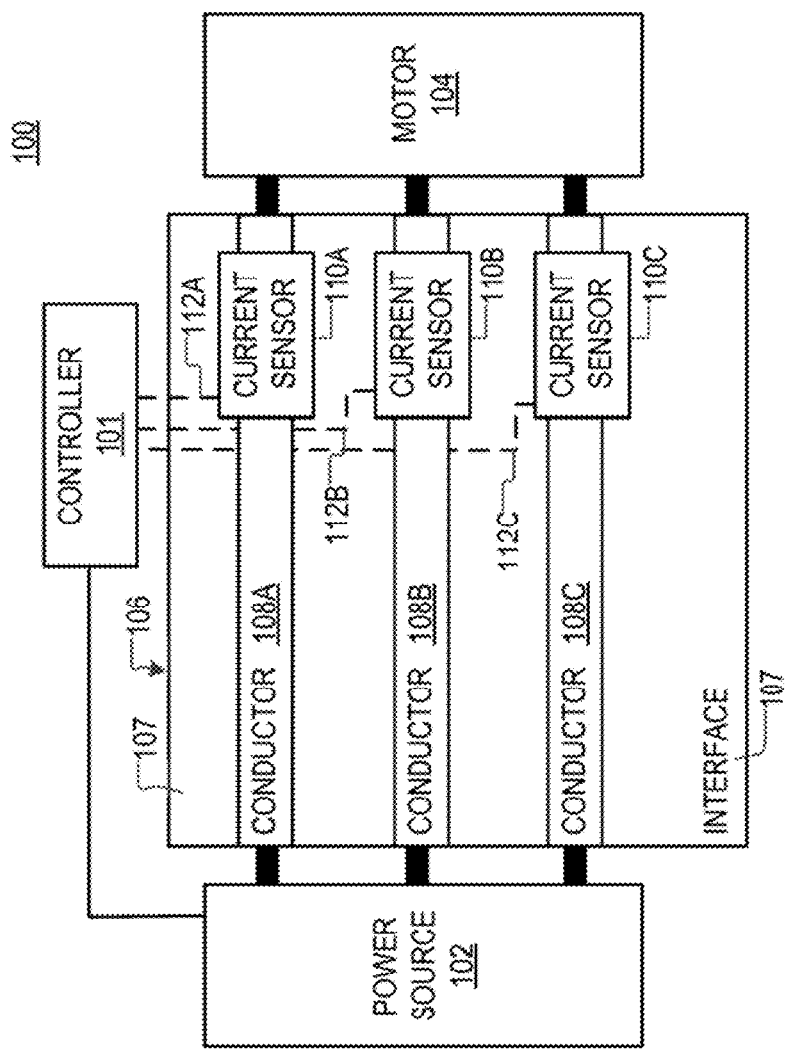
FIG. 1 is a diagram of an example of a system, according to aspects of the disclosure.

FIG. 1 is a diagram of an example of a system 100, according to aspects of the disclosure. As illustrated, the system 100 may include a controller 101 and a power source 102 that is coupled to an electric motor 104 via an interface 106.

The interface 106 may include a printed circuit board (PCB) 107. The PCB 107 may include conductors 108A-C and conductive traces 112A-C. Each of the conductive traces 112A-C may include one or more metal layers (or layers of another conductive material) that are at least partially encapsulated in a dielectric material of the PCB 107. Each of the conductors 108A-C may also include one or more metal layers (or layers of another conductive material) that are at least partially encapsulated in the dielectric material of the PCB 107. In some implementations, the conductive traces 112A-C may differ in one or more characteristics from the conductors 108A-C. According to the example of FIG. 1, each of the conductors 108A-C may be configured to carry higher currents than any of the conductive traces 112-C. Additionally or alternatively, in some implementations, each of the conductors 108A-C may have a larger cross-section than any of the conductive traces 112-C. Additionally or alternatively, in some implementations, each of the conductors 108A-C may have larger width and/or thickness than any of the conductive traces 112-C.

Each of the conductors 108A-C may be used to deliver, to the electric motor 104, current that is supplied by the power source 102. The controller 101 may be coupled to the current sensors 110A-C via the conductive traces 112A-C. The controller 101 may use the current sensors 110A-C to measure the level of the current that is being supplied by the power source 102 to the electric motor 104 and make adjustments to the operation of the power source 102 and/or the electric motor 104 in response to the measurements. Specifically, the controller 101 may use current sensor 110A to measure the current carried by conductor 108A, current sensor 110B to measure current carried by conductor 108B, and current sensor 110C to measure current carried by conductor 108C. Although in the example of FIG. 1 the interface 106 consists of three conductors 108, alternative implementations are possible in which the interface 106 consists of any number of conductors 108 (e.g., only one conductor, only two conductors, five conductors, etc.). Although in the example of FIG. 1 the interface 106 is used to electrically couple a motor to a power source, it will be understood that the present disclosure is not limited to any specific application of the interface 106.

In some implementations, any of conductors 108A-C may have a width between 8 mm and 30 mm, whereas each of the conductive traces 112A-C may have a width between 0.1 mm and 1 mm. Moreover, each of the conductors 108A-C may include one or more layers (e.g., 1-10 layers, etc.), each having thickness between 20 μm to 200 μm. As can be readily appreciated that conductors 108A-C may be adapted to carry much higher currents than the conductive traces 112A-C. By way of example, in some implementations, each of conductors 108A-C may be configured to carry current in the range of 50-500A, whereas each of the conductive traces may be configured to carry current in the range of 0.01A-5A. As noted above, in some implementations, both the conductors 108A-C and the conductive traces 112A-C may be embedded in the PCB 107. In some implementations, both the conductors 110A-C and the conductive traces 112A-C may be formed by using standard lithographic techniques that are normally applied in PCB manufacturing.

Figure 2:
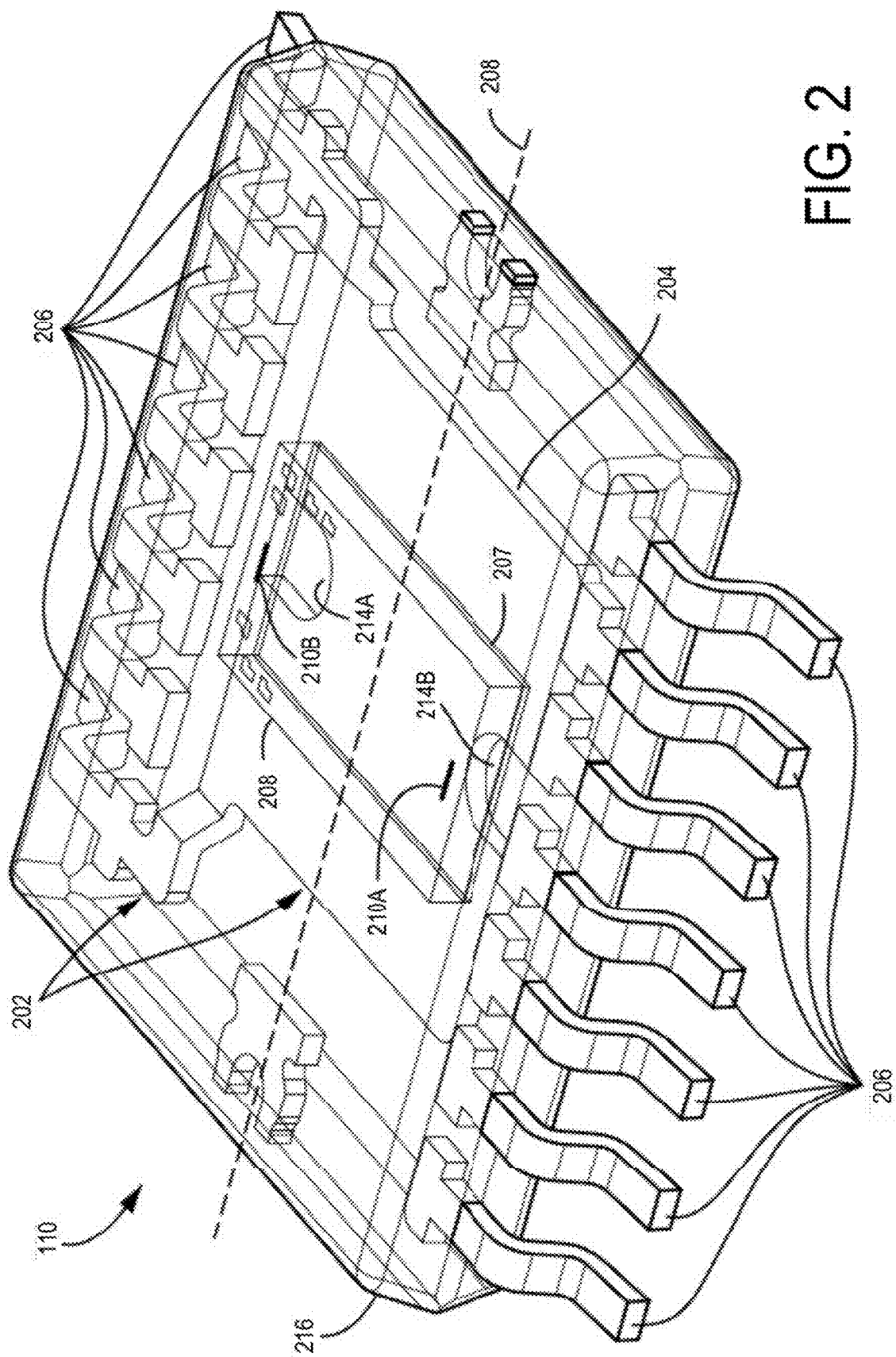
FIG. 2 is a diagram of an example of a current sensor, according to aspects of the disclosure.

FIG. 2 is a diagram of an example of a current sensor 110, according to aspects of the disclosure. As the numbering suggests, the current sensor 110 may be the same or similar to any of the current sensors 110A-C, which are shown in FIG. 1. It will be understood that FIG. 2 is provided as an example only, and the interface 106 is not limited to using any specific type of current sensor.

Features of current sensor 110 include a lead frame 202 and a die 208 supporting magnetic field sensing elements 210A and 210B. Lead frame 202 includes a die attach paddle 204 and a plurality of leads 206. Die 208 is attached to die attach paddle 204, as may be achieved with an adhesive layer 207. While a single semiconductor die 208 is shown, the current sensor 110 can include more than one die, with each such die supporting magnetic field sensing element(s) and/or supporting circuitry. Additional features of the example current sensor 110 can include one or more cutouts, slits, slots or apertures 214A, 214B in the paddle 204 to reduce eddy currents and mold material 216 to enclose die attach paddle 204, die 208, magnetic field sensing elements 210A and 210B and portions of leads 206, shown. Aspects of current sensor 110 are shown and described in U.S. Pat. No. 10,481,181, entitled "Systems and Methods For Current Sensing" and issued on Nov. 19, 2019, which patent is hereby incorporated herein by reference in its entirety. In use, current sensor 110 is configured to be positioned proximate to a conductor, such as any of the conductors 108A-C, which are shown in the configuration of FIG. 1. Although in the example of FIG. 2, the sensor 110 includes two magnetic field sensing elements, alternative implementations are possible in which the sensor 110 includes only one magnetic field sensing element or more than two magnetic field sensing elements.

Figure 3:
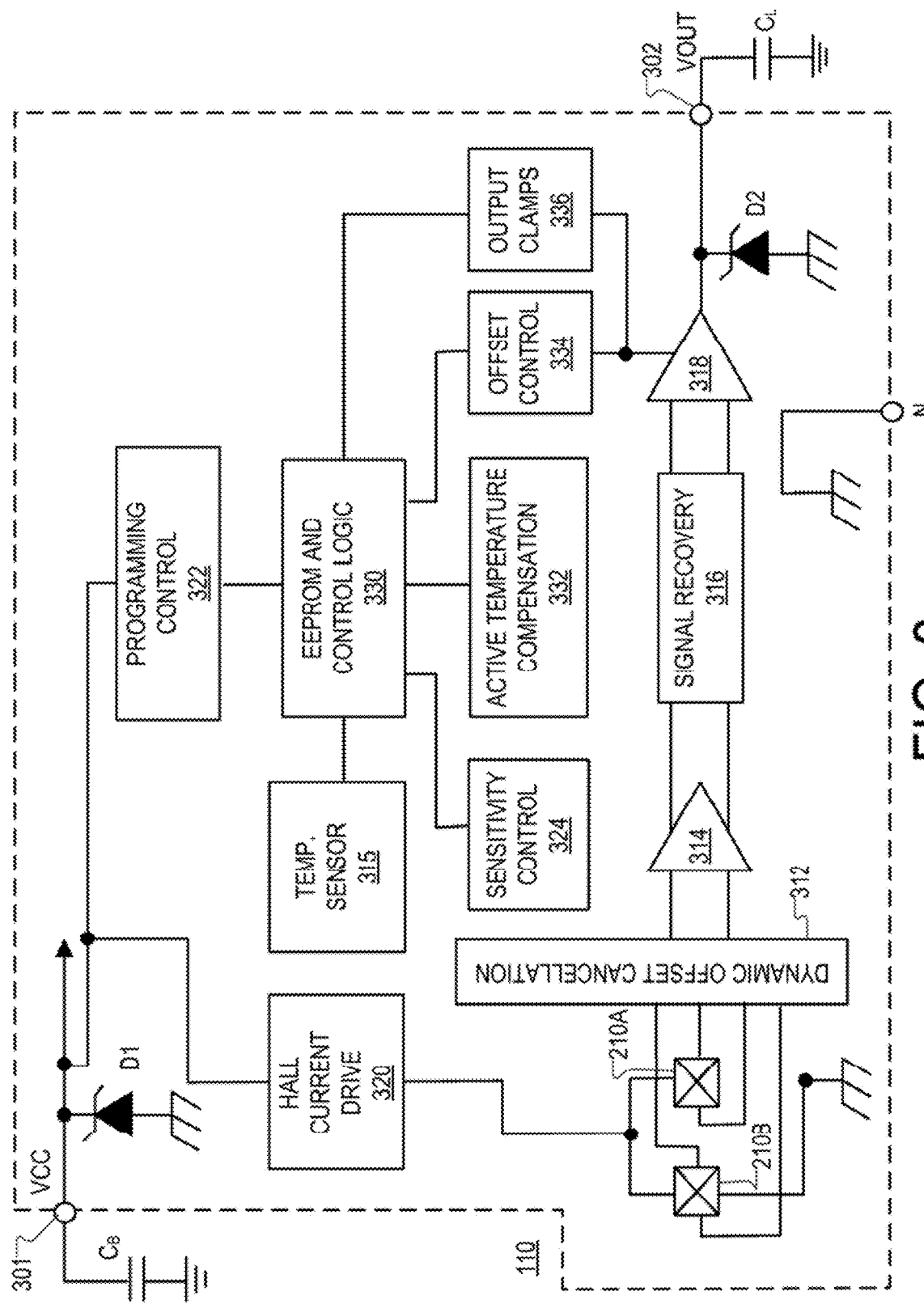
FIG. 3 is a diagram of an example of a current sensor, according to aspects of the disclosure.

FIG. 3 is a circuit diagram illustrating one possible implementation of the electronic circuitry of the sensor 110.

The sensor 110 may be configured to output a signal VOUT that is proportional to $\Delta B = B_R - B_L$ where $B_R$ represents magnetic field incident on one of the magnetic field sensing elements 210A-B and $B_L$ represents magnetic field incident on the other one of the magnetic field sensing elements 210A-B. The sensor output VOUT is also affected by the sensitivity, a, of the signal path and can be represented as follows:

$$VOUT = \alpha \times \Delta B \quad (1)$$

The relationship between the conductor current to be measured and the differential field $\Delta B$ can be represented by a coupling coefficient, K(f) as follows:

$$\Delta B = K(f) \times I \quad (2)$$

It will be appreciated that coupling coefficient K(f) corresponds to coupling (e.g., transfer of energy, etc.) between a given current sensor and varies with frequency. As is discussed further below, the design of the conductors 108A-C helps reduce the variation of the coupling coefficient K(f) with respect to the frequency of the current that is being transmitted over conductors 108A-C.

The sensor 110 may include a VCC (supply voltage) pin 301, a VOUT (output signal) pin 302. The VCC pin 301 is used for the input power supply or supply voltage for the current sensor 110. A bypass capacitor, CB, can be coupled between the VCC pin 301 and ground. The VCC pin 301 can also be used for programming the current sensor 110. The VOUT pin 302 is used for providing the output signal VOUT to circuits and systems (not shown) such as controller 101 (FIG. 1) and can also be used for programming. An output load capacitance CL is coupled between the VOUT pin 302 and ground. The example current sensor 110 can include a first diode D1 coupled between the VCC pin 301 and chassis ground and a second diode D2 coupled between the VOUT pin 302 and chassis ground.

The driver circuit 320 may be configured to drive the magnetic field sensing elements 210A and 210B. Magnetic field signals generated by the magnetic field sensing elements 210A and 210B are coupled to a dynamic offset cancellation circuit 312, which is further coupled to an amplifier 314. The amplifier 314 is configured to generate an amplified signal for coupling to the signal recovery circuit 316. Dynamic offset cancellation circuit 312 may take various forms including chopping circuitry and may function in conjunction with offset control circuit 334 to remove offset that can be associated with the magnetic field sensing elements 210A-B and/or the amplifier 314. For example, offset cancellation circuit 312 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 110 to regulate the supply voltage.

A programming control circuit 322 is coupled between the VCC pin 301 and EEPROM and control logic circuit 330 to provide appropriate control to the EEPROM and control logic circuit. EEPROM and control logic circuit 330 determines any application-specific coding and can be erased and reprogrammed using a pulsed voltage. A sensitivity control circuit 324 can be coupled to the amplifier 314 to generate and provide a sensitivity control signal to the amplifier 314 to adjust a sensitivity and/or operating voltage of the amplifier 314. An active temperature compensation circuit 332 can be coupled to sensitivity control circuit 324, EEPROM and control logic circuit 330, and offset control circuit 334. The offset control circuit 334 can generate and provide an offset signal to a push/pull driver circuit 318 (which may be an amplifier) to adjust the sensitivity and/or operating voltage of the driver circuit 318. The active temperature compensation circuit 332 can acquire temperature data from EEPROM and control logic circuit 330 via a temperature sensor 315 and perform necessary calculations to compensate for changes in temperature, if needed. Output clamps circuit 336 can be coupled between the EEPROM and control logic circuit 330 and the driver circuit 318 to limit the output voltage and for diagnostic purposes.

Figure 4:
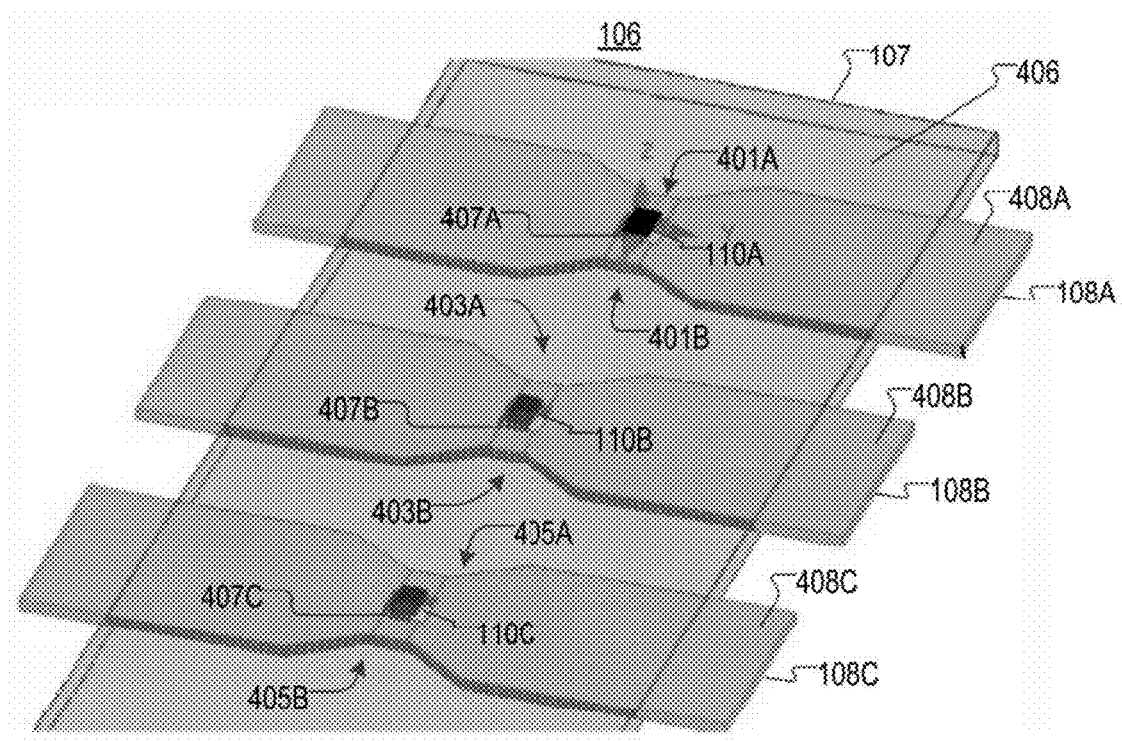
FIG. 4 is a perspective view of an example of a system, according to aspects of the disclosure.

FIG. 4 is a perspective view of the interface 106, according to aspects of the disclosure. As illustrated, the conductor 108A may include a through-hole 407A formed therein, and the current sensor 110A may be disposed above or below the through-hole. The sensor 110A may be mounted on the PCB 107 and the leads 206 of the sensor 110A may be electrically coupled to the conductive traces 112A. A notch 401A may be formed in the conductor 108A on one side of the through-hole 407A. And a notch 401B may be formed in the conductor 108A on the other side of the through-hole 407A. In some implementations, notches 401A-B may be altogether omitted from the conductor 108A.

The conductor 108B may include a through-hole 407B formed therein, and the current sensor 110B may be disposed above or below the through-hole, as shown. The sensor 110B may be mounted on the PCB 107 and the leads 206 of the sensor 110B may be electrically coupled to the conductive traces 112B. A notch 403A may be formed in the conductor 108B on one side of the through-hole 407B. And a notch 403B may be formed in the conductor 108B on the other side of the through-hole 407B. In some implementations, notches 403A-B may be altogether omitted from the conductor 108B.

The conductor 108C may include a through-hole 407C formed therein, and the current sensor 110C may be disposed above or below the through the hole, as shown. The sensor 110C may be mounted on the PCB 107 and the leads 206 of the sensor 110C may be electrically coupled to the conductive traces 112C. A notch 405A may be formed in the conductor 108C on one side of the through-hole 407C. And a notch 405B may be formed in the conductor 108C on the other side of the through-hole 407C. In some implementations, notches 405A-B may be altogether omitted from the conductor 108C.

The PCB 107 may have a main surface 406. The conductor 108A may have a main surface 408A that is substantially parallel to the main surface 406 of the PCB 107. The conductor 108B may have a main surface 408B that is substantially parallel to the main surface 406 of the PCB 107. And the conductor 108C may also have a main surface 408C that is substantially parallel to the main surface 406 of the PCB 107.

Figure 5A:
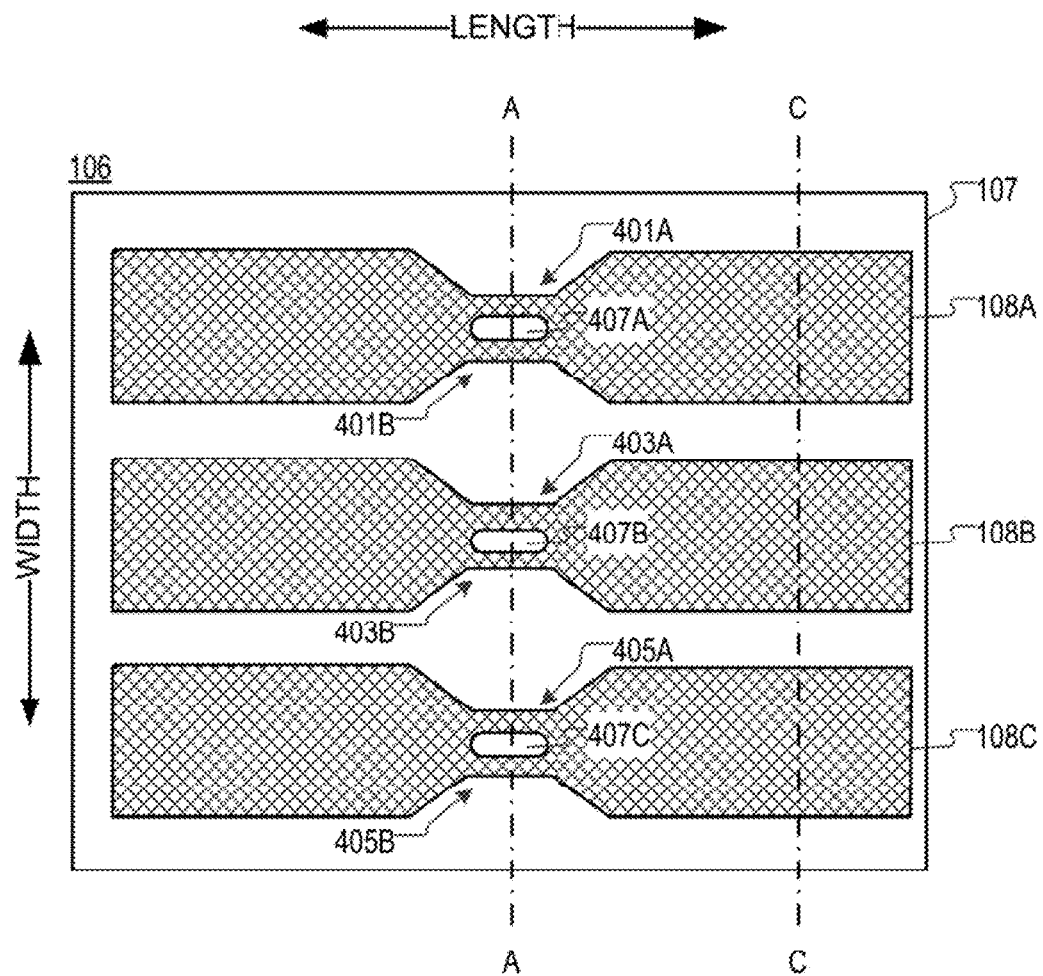
FIG. 5A is a planar view of the system of FIG. 4, according to aspects of the disclosure.

FIG. 5A is a planar top-down view of the interface 106, with the sensors 110A-C removed. In the example of FIG. 5A, each of the through-holes 407A-C is centered on an axis A-A. However, alternative implementations are possible in which one or more of the through-holes 407A-C are offset from axis A-A. For instance, one of the through-holes 407A-C may be situated to the left of axis A-A and another one of the through-holes 407A-C may be situated to the right of axis A-A.

In the example of FIG. 5A, each of the notches 401A-B is centered on axis A-A. However, alternative implementations are possible in which one or more of the notches 401A-B are offset from axis A-A to accommodate the placement of additional hardware on the PCB 107. For instance, one of the notches 401A-B may be formed to the left of axis A-A and the other one of the notches 401A-B may be formed to the right of axis A-A. In the example of FIG. 5A, notch 401A has the same size and shape as notch 401B. However, alternative implementations are possible in which notch 401A has a different size and/or shape than notch 401B.

In the example of FIG. 5A, each of the notches 403A-B is centered on axis A-A. However, alternative implementations are possible in which one or more of the notches 403A-B are offset from axis A-A to accommodate the placement of additional hardware on the PCB 107. For instance, one of the notches 403A-B may be formed to the left of axis A-A and the other one of the notches 403A-B may be formed to the right of axis A-A. In the example of FIG. 5A, notch 403A has the same size and shape as notch 403B. However, alternative implementations are possible in which notch 403A has a different size and/or shape than notch 403B.

In the example of FIG. 5A, each of the notches 405A-B is centered on axis A-A. However, alternative implementations are possible in which one or more of the notches 405A-B are offset from axis A-A to accommodate the placement of additional hardware on the PCB 107. For instance, one of the notches 405A-B may be formed to the left of axis A-A and the other one of the notches 405A-B may be formed to the right of axis A-A. In the example of FIG. 5A, notch 405A has the same size and shape as notch 405B. However, alternative implementations are possible in which notch 405A has a different size and/or shape than notch 405B. In some implementations providing the notches 401-405 on the conductors 108A-C, respectively, may help reduce cross-talk interference between neighboring ones of the conductors 108A-C. Cross talk between two neighboring conductors 108 may occur when the sensor 110 that is mounted over one of the conductors 108 senses a magnetic field that is generated by the other conductor 108.

Figure 5B:
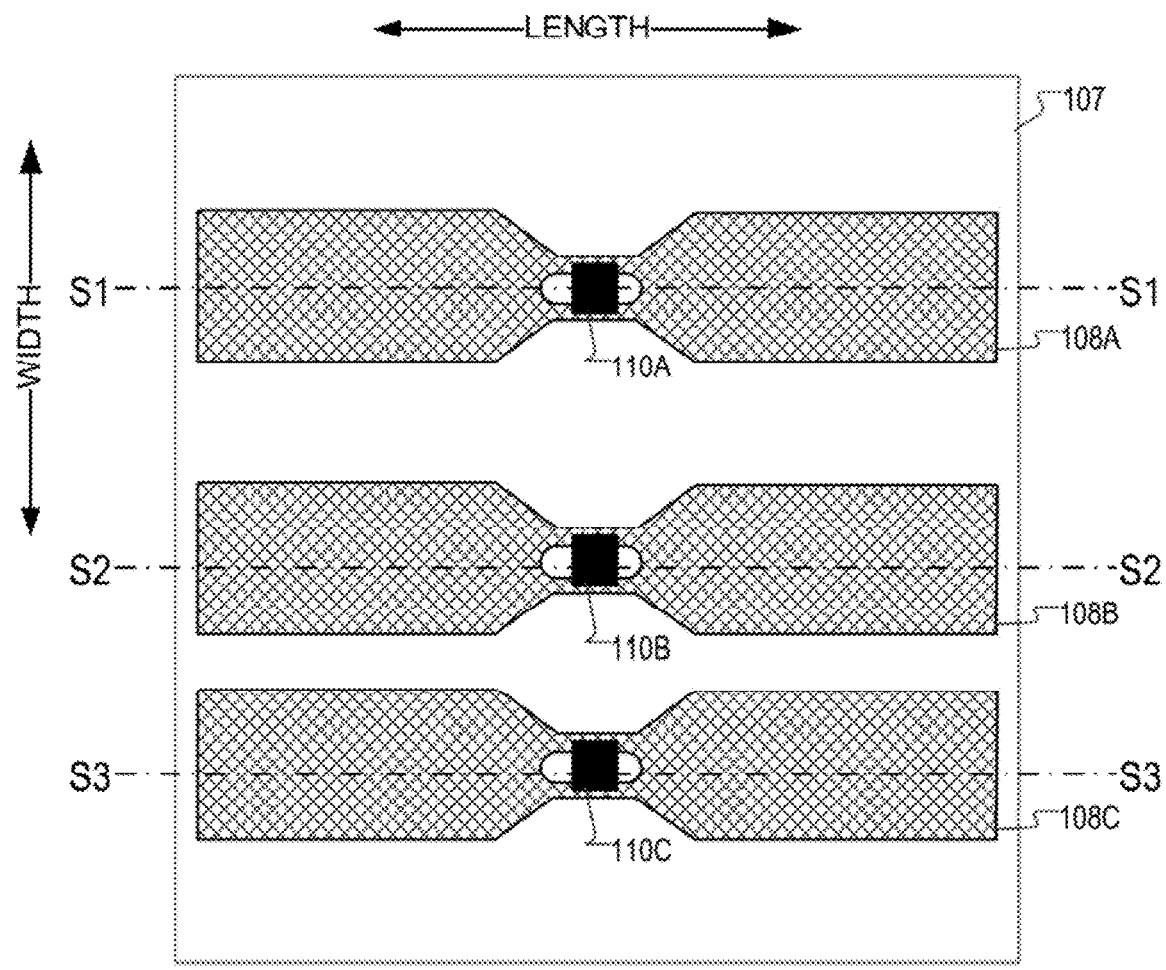
FIG. 5B is a planar view of the system of FIG. 4, according to aspects of the disclosure.

FIG. 5B is a planar top-down view of the interface 106, with the sensors 110A-C present. As illustrated in FIG. 5B, the sensor 110A may have an axis of maximum sensitivity S1-S1 that is substantially perpendicular to the length and width of the conductor 108A. The sensor 110B may have an axis of maximum sensitivity S2-S2 that is substantially perpendicular to length and width of the conductor 108B. The sensor 110C may have an axis of maximum sensitivity S3-S3 that is substantially perpendicular to length and width of the conductor 108C. The phrase "substantially perpendicular" as used throughout the disclosure shall mean "within 5 degrees of being perpendicular." It will be understood that the present disclosure is not limited to any specific orientation of the axis of maximum sensitivity of any of the sensors 110A-C for as long as the sensor is able to sense the level of the current flowing through its respective conductor 108.

Figure 5C:
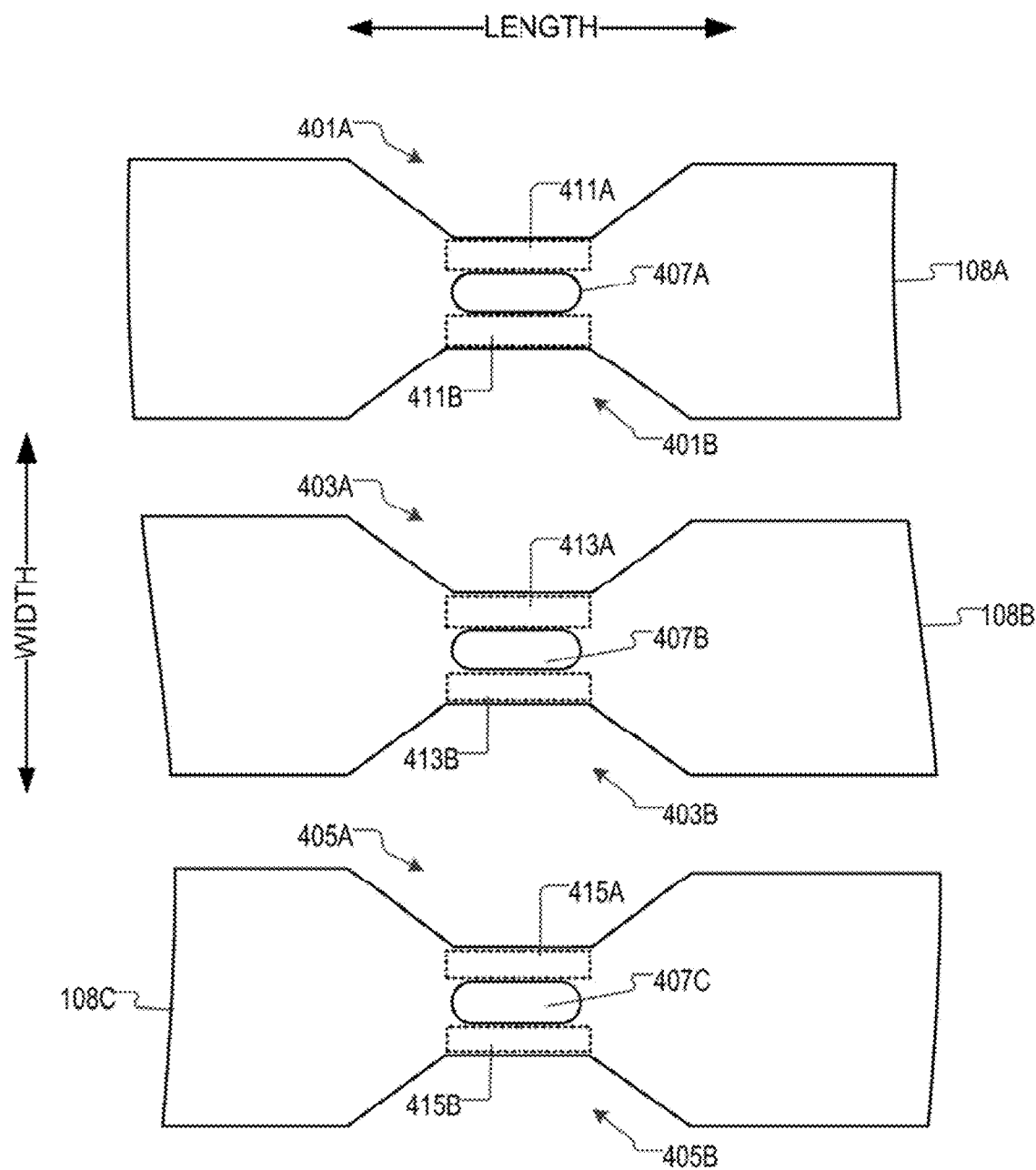
FIG. 5C is a planar view of a portion the system of FIG. 4, according to aspects of the disclosure.

FIG. 5C is a partial planar top-down view of the conductors 108A-C, according to aspects of the disclosure. As illustrated in FIG. 5C, through-hole 407A (and optionally the notches 401A-B) may define legs 411A and 411B in the conductor 108A. Legs 411A-B are denoted by dashed rectangles in FIG. 5C. Legs 411A and 411B, according to the present example, have the same width. However, alternative implementations are possible in which leg 411A has a different width than leg 411B. The distance between legs 411A and 411B may be selected, such that it is large enough to avoid the creation of eddy currents between the legs 411A and 411B, while ensuring that the coupling coefficient K(f) between the legs 411A-B and the sensor 110 is large enough to meet the specification of the sensor 110A for reliable operation. In some respects, decreasing the width of the conductor 108A by forming legs 411A-B may help reduce the variability of the coupling coefficient K(f) with respect to the frequency of the current that is carried over the conductor 108A.

Through-hole 407B (and optionally the notches 403A-B) may define legs 413A and 413B in the conductor 108B. Legs 413A-B are denoted by dashed rectangles in FIG. 5C. Legs 413A and 413B, according to the present example, have the same width. However, alternative implementations are possible in which leg 413A has a different width than leg 413B. The distance between legs 413A and 413B may be selected, such that it is large enough to avoid the creation of eddy currents between the legs 413A and 413B, while ensuring that the coupling factor K(f) between the legs 413A-B and the sensor 110B is large enough to meet the specification of the sensor 110B for reliable operation. In some respects, decreasing the width of the conductor 108B by forming legs 413A-B may help reduce the variability of the coupling coefficient K(f) with respect to the frequency of the current that is carried over the conductor 108B.

Through-hole 407C (and optionally the notches 405A-B) may define legs 415A and 415B in the conductor 108C. Legs 415A-B are denoted by dashed rectangles in FIG. 5C. Legs 415A and 415B, according to the present example, have the same width. However, alternative implementations are possible in which leg 415A has a different width than leg 415B. The distance between legs 415A and 415B may be selected, such that it is large enough to avoid the creation of eddy currents between the legs, while ensuring that the coupling factor K(f) between legs 415A-B and the sensor 110C is large enough to meet the specification of the sensor 110C for reliable operation. In some respects, decreasing the width of the conductor 108C by forming legs 415A-B may help reduce the variability of the coupling coefficient K(f) with respect to the frequency of the current that is carried over the conductor 108C.

In some respects, the increase in resistance of the conductor 108A-C, which results from reducing the width of the conductors 108A-C (at legs 411-415 respectively) may be calculated by using Equation 3 below:

$$\Delta R = \left(\frac{\rho}{T}\right)\left(\frac{LS}{WT} + 2\frac{NL - Ls}{W + S + WT} - \frac{NL}{W}\right). \quad (3)$$

Figure 5D:
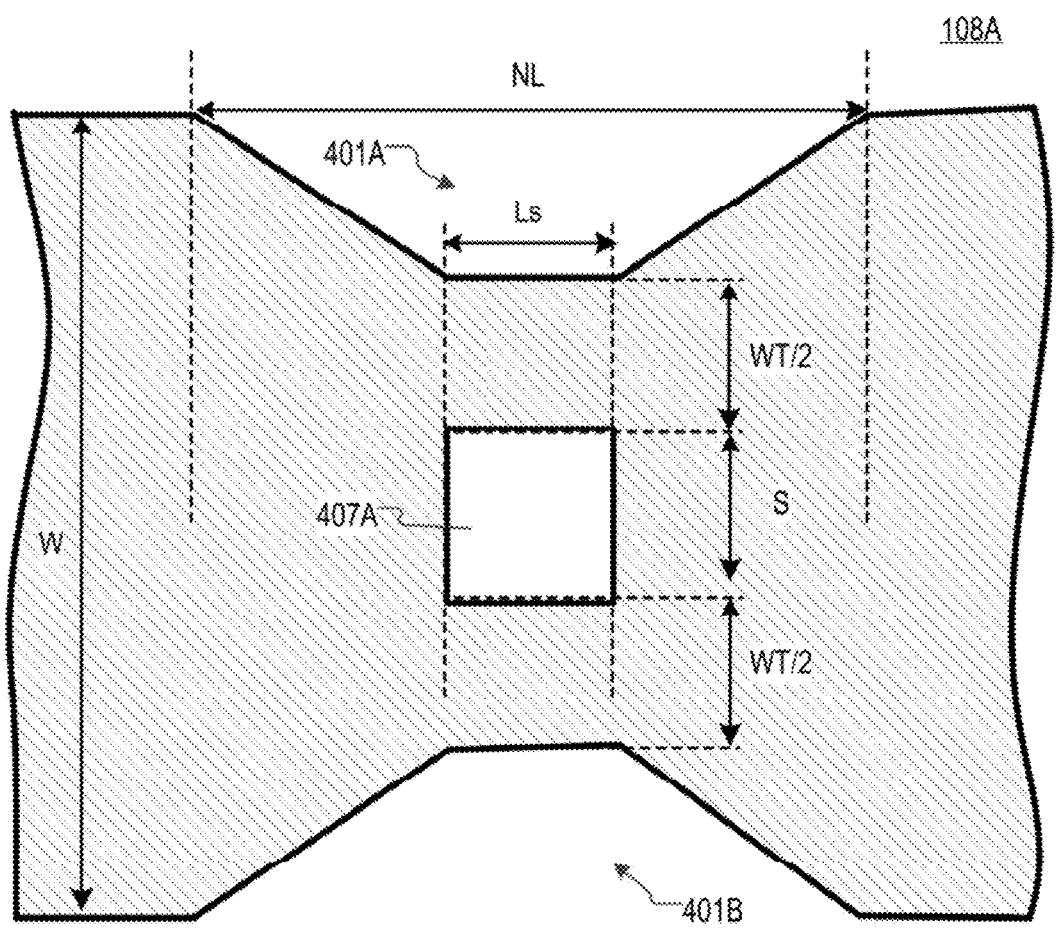
FIG. 5D is a partial view of a conductor, according to aspects of the disclosure.

Dimensions W, S, $L_s$, NL, WT are shown in FIG. 5D. In addition, T is the thickness of any of conductors 108A-C. In implementations in which a conductor 108 includes multiple layer, the thickness of the conductor 108 may be equal to the sum of the thicknesses of the conductor's constituent layers. The thickness of each 108A-C may be a dimension that is perpendicular to both of dimensions NL and W. Although FIG. 5D shows a partial view of conductor 108A, it will be understood that conductors 108B and 108C may have a similar configuration. In one example $\rho$=2e–8$\Omega$m. Additionally or alternatively, in some implementations, dimensions W, T, S, $L_S$, NL, WT may have the following values: W=25 mm, T=0.5 mm, S=5 mm, $L_s$=5 mm, NL=20 mm, and WT=9 mm. In some respects, Equation 3 illustrates that introducing a respective through-hole in each of the conductors 108A-C to form two separate legs results in a smaller increase in resistance of the conductors 108A-C in comparison to similar techniques that rely solely on notching.

Figure 6A:
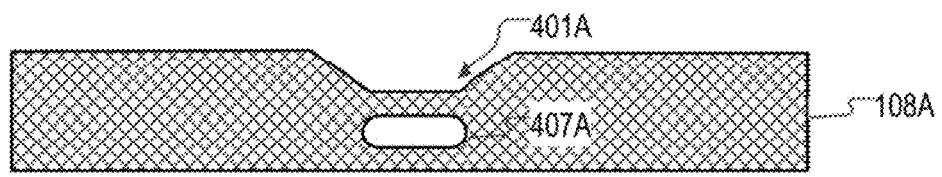
FIG. 6A is a diagram of an example of a conductor, according to aspects of the disclosure.
Figure 6B:
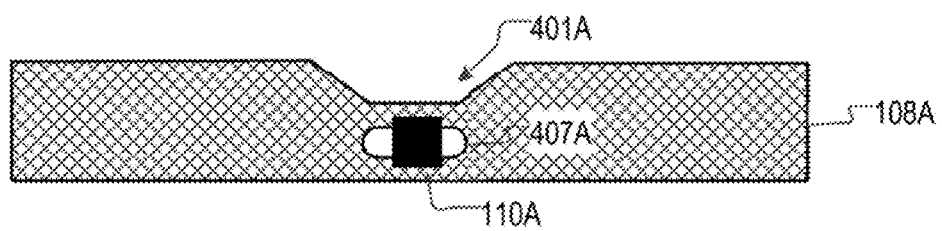
FIG. 6B is a diagram illustrating the use of the conductor of FIG. 6A, according to aspects of the disclosure.

FIGS. 6A-B illustrate an example of the conductor 108A, in accordance with an alternative implementation. FIGS. 6A-B illustrate that in some implementations, the conductor 108A may include only one notch (e.g., notch 401). Although FIGS. 6A-B show the conductor 108A only, it will be understood that in some implementations, any or all of conductors 108B-C may have the same configuration.

Figure 7A:
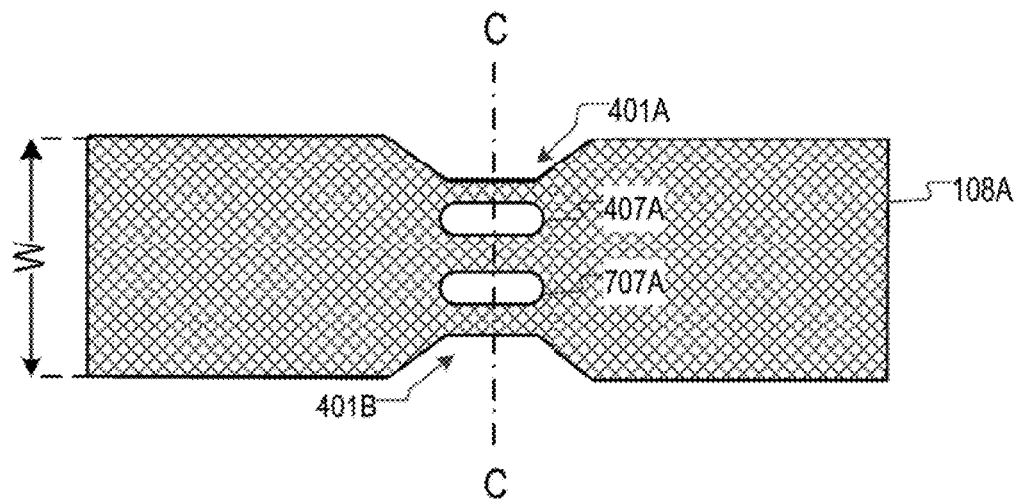
FIG. 7A is a diagram of an example of a conductor, according to aspects of the disclosure.
Figure 7B:
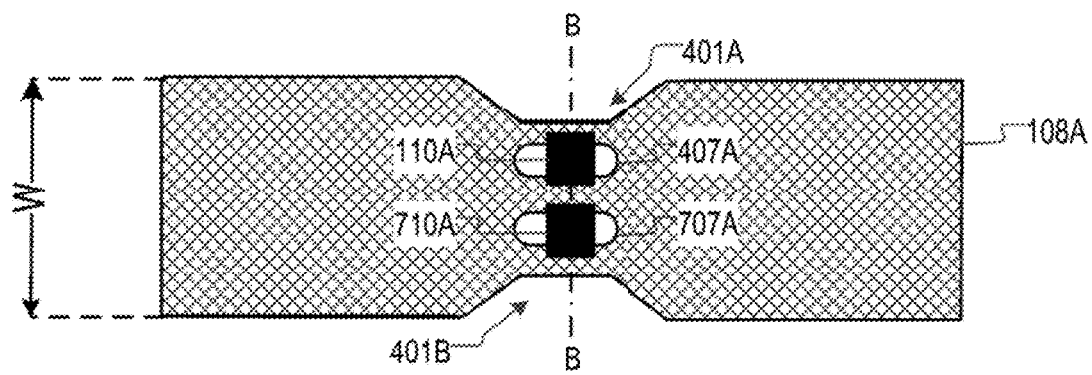
FIG. 7B is a diagram illustrating the use of the conductor of FIG. 7A, according to aspects of the disclosure.

FIGS. 7A-B illustrate an example of the conductor 108A, in accordance with an alternative implementation. FIGS. 7A-B illustrate that in some implementations the conductor 108A may be provided with an additional through-hole 707A, as well as an additional sensor 710A that is mounted over the through-hole 707A. The sensor 710A may be the same or similar to the sensor 110A. In some implementations, the sensor 710A may have a function that is redundant to that of the sensor 110A and it may be provided to increase the reliability of the interface 106. For instance, the sensor 710A may be provided to achieve a higher Automotive Safety Integrity Level (ASIL) rating of the interface 106. According to the example of FIGS. 7A-B, the through-holes 407A and 707A are centered on an axis B-B, which extends along the width W of the conductor 108A. However, alternative implementations are possible in which at least one of the through-holes 407A and 707B is offset from the axis B-B. For instance, through-hole 407A may be formed to the left of axis B-B and through-hole 707A may be formed to the right of axis B-B. According to the example of FIGS. 7A-B, through-holes 407A and 707A are the same size and shape. However, alternative implementations are possible in which the through-holes 407A and 707A have different shapes and/or sizes. Although FIGS. 7A-B show the conductor 108A only, it will be understood that in some implementations, any or all of conductors 108B-C may have the same configuration.

Figure 8A:
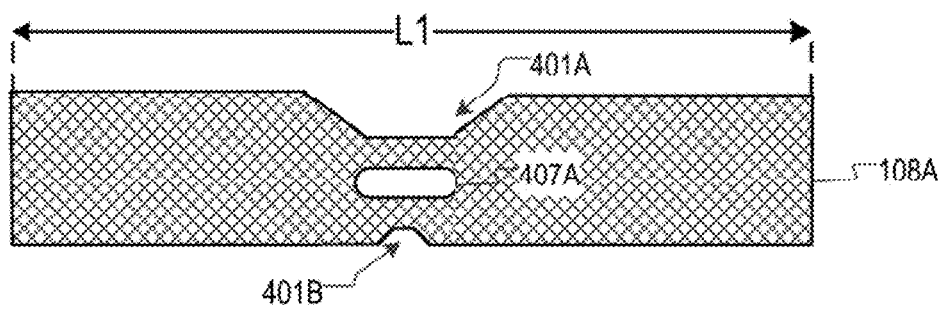
FIG. 8A is a diagram of an example of a conductor, according to aspects of the disclosure.
Figure 8B:
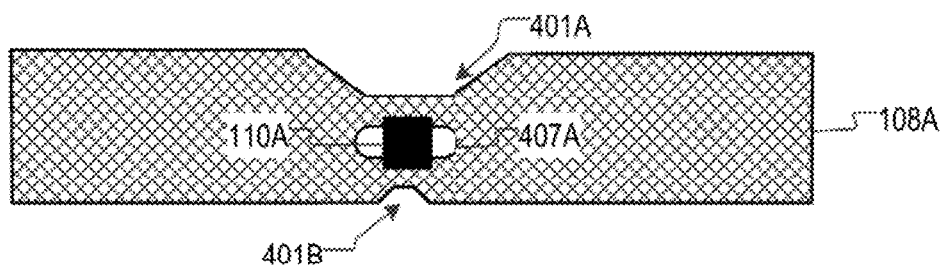
FIG. 8B is a diagram illustrating the use of the conductor of FIG. 8A, according to aspects of the disclosure.

FIGS. 8A-B illustrate an example of the conductor 108A, in accordance with an alternative implementation. FIGS. 8A-B illustrate that in some implementations, the notches 401A and 401B of the conductor 108A may have different shapes and sizes. Although FIGS. 8A-B show the conductor 108A only, it will be understood that in some implementations, any or all of conductors 108B-C may have the same configuration.

Figure 9A:
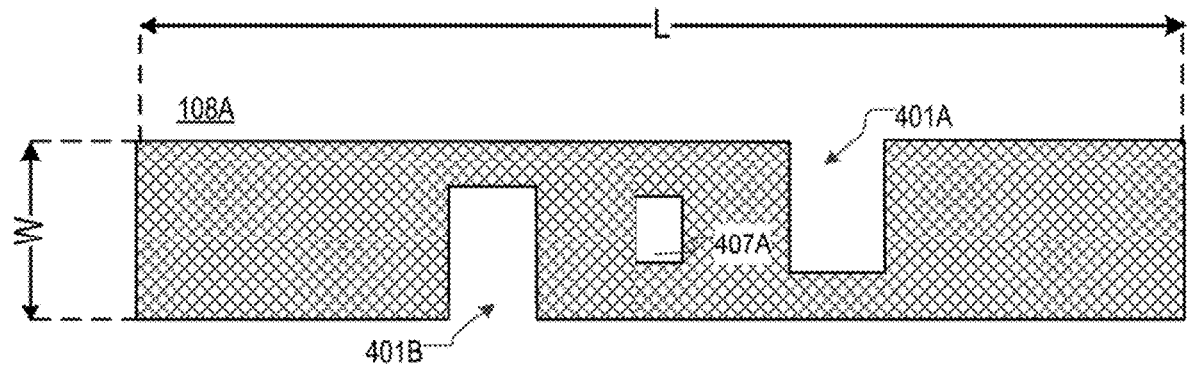
FIG. 9A is a diagram of an example of a conductor, according to aspects of the disclosure.
Figure 9B:
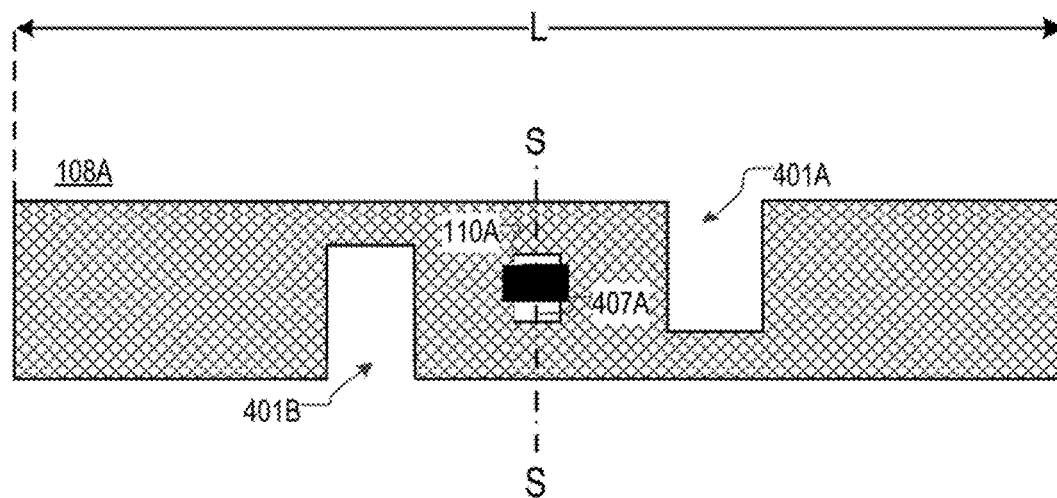
FIG. 9B is a diagram illustrating the use of the conductor of FIG. 9A, according to aspects of the disclosure.

FIGS. 9A-B illustrate an example of the conductor 108A, in accordance with an alternative implementation. FIGS. 9A-B illustrate that in some implementations, the notches 401A and 401B of the conductor 108A may be spaced apart from one another along the length L of the conductor 108A. This is in contrast to the preceding examples, in which the notches 401A-B are spaced apart from one another along the width of the conductor 108A. Although FIGS. 9A-B show the conductor 108A only, it will be understood that in some implementations, any or all of conductors 108B-C may have the same configuration. In the example of FIGS. 9A-B, the sensor 110A may have an axis of maximum sensitivity that is perpendicular (or otherwise transverse) to the length L and width W of the conductor 108A. The configuration shown in FIGS. 9A-B may prevent the sensor 110A from sensing magnetic field(s) generated by neighboring conductor(s). In other words, arranging the sensor 110A in the manner shown in FIGS. 9A-B may help reduce crosstalk between the sensor 110A and neighboring conductors (e.g., the conductors 110B-C, etc.). It will be understood that the present disclosure is not limited to any specific orientation of the axis of maximum sensitivity of the sensors 110A for as long as the sensor is able to sense the level of the current flowing through conductor 108A.

FIG. 10A is a cross-sectional side view of the interface 106 that is taken along axis T-T (shown in FIG. 5A). Depicted in FIG. 10A is the structure of the conductor 108A in accordance with one particular implementation. In this implementation, the conductor 108A includes a plurality of metal layers 1002 that are separated from each other by layers of dielectric material 1004. Each of the metal layers 1002 may have the same width W as the rest of the metal layers 1002. However, alternative implementations are possible in which at least two of the metal layers 1002 have different widths. In the example of FIG. 10A, each of the metal layers 1002 has the same thickness. However, alternative implementations are possible in which at least two of the metal layers 1002 have different thicknesses. Furthermore, in the example of FIG. 10A, the metal layers 1002 are situated directly over one another, such that none of the metal layers 1002 overhangs another one of the metal layers 1002. However, alternative implementations are possible in which at least one of the metal layers 1002 overhangs another one of the metal layers 1002. (e.g., see FIG. 10C). Furthermore, in the example of FIG. 10A each of the metal layers 1002 has a main surface that are substantially parallel to the main surface 406 of the PCB 107.

FIG. 10B is a cross-sectional side view of the interface 106 that is taken along axis A-A (shown in FIG. 5A). FIG. 10B illustrates that the through-hole 407A may extend through all metal layers of the conductor 108A. FIG. 10B further illustrates that the through-hole 407A may be filled with a dielectric material.

FIG. 10C shows an example of the conductor 108A, in accordance with an alternative implementation. More particularly, FIG. 10C is a cross-sectional side view of the conductor 108A that is taken along axis A-A (shown in FIG. 5A). In the example of FIG. 10C, leg 411A is formed of metal layers 1002A-E. As illustrated, each of the metal layers 1002A-E may be formed in a different plane. At least some of the metal layers 1002A-E may have a different width and they may overhang one another, as shown. According to the example of FIG. 10C, metal layers 1002B-1002E are integral metal layers and metal layer 1002A is a segmented metal layer. Metal layer 1002A may include a plurality of segments 1003 that are separated from one another by the dielectric material (which is also used to separate the metal layers 1002A-E). Each of the segments 1003 may have a width that is smaller than a width of the metal layer 1002E and/or the width of one or more of the metal layers 1002B-D.

In the example of FIG. 10C, leg 411B is formed of metal layers 1002F-J. As illustrated, each of the metal layers 1002F-J may be formed in a different plane. Each of the metal layers may be formed of a conductive material (e.g., metal). Furthermore, at least some of the metal layers 1002 F-J may have a different width and they may overhang one another, as shown. According to the example of FIG. 10C, metal layers 1002F-G and 10021-J are integral metal layers and metal layer 1002H is a segmented metal layer. Metal layer 1002H may include a plurality of segments 1005 that are separated from one another by the dielectric material (which is also used to separate the metal layers 1002F-J). Each of the segments 1005 may have a width that is smaller than the width of the metal layer 1002E and/or the width of one or more of the metal layers 1002B-D. In some implementations, the remaining portions of the conductor 108A also have the configuration shown in FIG. 10C. Although FIG. 10C shows the conductor 108A only, it will be understood that in some implementations, any of conductors 108B-C may have the same configuration.

FIG. 10D shows an example of the conductor 108A, in accordance with an alternative implementation. More particularly, FIG. 10D is a cross-sectional side view of the conductor 108A that is taken along axis A-A (shown in FIG. 5A). In the example of FIG. 10D, leg 411A is formed of metal layers 1002 (depicted as solid black rectangles). The metal layers 1002 may be partially separated by layers of dielectric material that are disposed between the metal layers 1002. The metal layers 1002 may be electrically coupled to one another by conductive vias 1008 that are formed in the ends of the metal layers 1002, and which are depicted as cross-hatched rectangles. Leg 411B is similarly formed of metal layers 1002 (depicted as solid black rectangles). The metal layers 1002 may be partially separated by layers of dielectric material that are disposed between the metal layers 1002. The metal layers 1002 may be electrically coupled to one another by conductive vias 1008 that are formed in the ends of the metal layers 1002, and which are depicted as cross-hatched rectangles. In some implementations, the remaining portions of the conductor 108A also have the configuration shown in FIG. 10D. Although FIG. 10D shows the conductor 108A only, it will be understood that in some implementations, any of conductors 108B-C may have the same configuration.

Figure 11A:
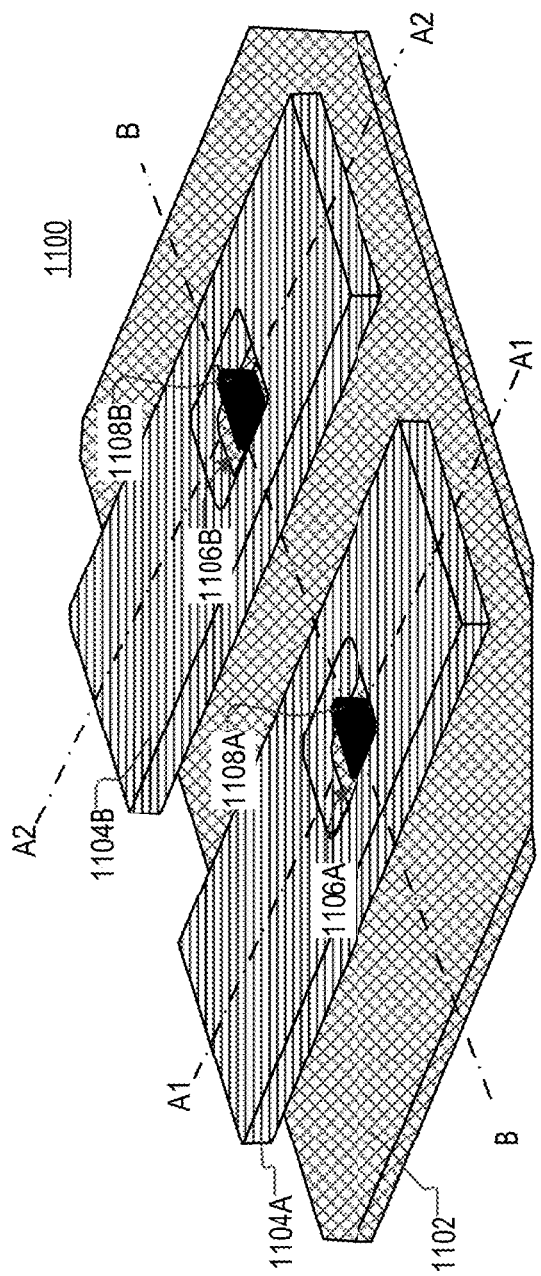
FIG. 11A is a perspective view of an example of a system, according to aspects of the disclosure.
Figure 11B:
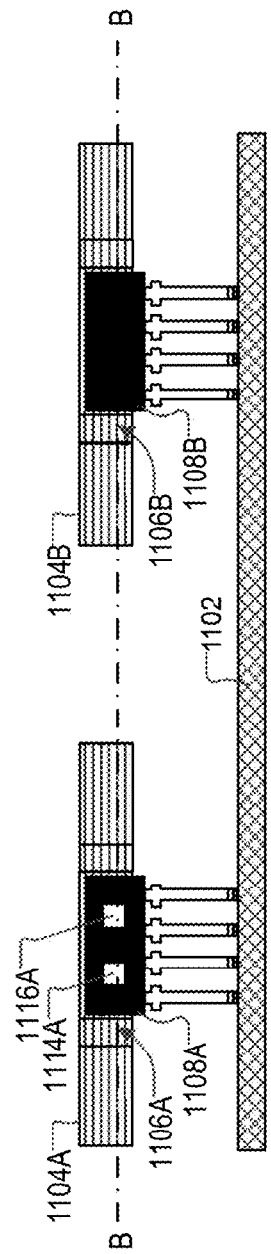
FIG. 11B is a cross-sectional side view of the system of FIG. 11A, according to aspects of the disclosure.

FIGS. 11A-B show a perspective view of an example of a system 1100, according to aspects of the disclosure. As illustrated, the system may include conductors 1104A-B that are disposed over a printed circuit board (printed circuit board) 1102. Conductor 1104A may include a through-hole 1106A, and conductor 1104B may include a through-hole 1106B. A current sensor 1108A may be disposed inside the through-hole 1106A and used to measure an electrical current through the conductor 1104A. The current sensor 1108A may be the same or similar to the current sensor 110, which is discussed above with respect to FIG. 2. A current sensor 1108B may be disposed inside the through-hole 1106B and used to measure an electrical current through the conductor 1104B. The current sensor 1108B may be the same or similar to the current sensor 110, which is discussed above with respect to FIG. 2. According to the example of FIG. 11A, conductor 1104A has a longitudinal axis A1-A1, conductor 1104B has a longitudinal axis A2-A2 that is substantially parallel to the axis A1-A1, and the system 1100 has an axis B-B that is substantially perpendicular to the longitudinal axes A1-A1 and A2-A2.

As illustrated in FIG. 11B, current sensors 1108A-B may be aligned with the axis B-B. Furthermore, magnetic field sensing elements 1114A and 1116A, which are part of current sensor 1108A, may be aligned with the axis B-B. However, a disadvantage of this configuration is that it suffers from high crosstalk between the current sensor 1108A and the conductor 1104B. This can be readily understood from FIG. 11B, which shows that magnetic field sensing element 1116A is closer to conductor 1104B than magnetic field sensing element 1114A. Thus, the magnetic field (or magnetic flux density) generated by conductor 1104B is greater on magnetic field sensing element 1116A than magnetic field sensing element 1114A. As a result of this disparity, the accuracy of the current sensor 1108A may be reduced.

The discussion that follows with respect to FIGS. 12A-24B shows alternative configurations that address the disadvantages of the configuration of FIGS. 11A-B. Each of the configurations discussed with respect to any of FIGS. 12A-24B is advantageous because, in comparison to the configuration of FIGS. 11A-B, it exhibits reduced crosstalk between current sensors and adjacent conductors, which in turn may help increase the accuracy of the current sensors. The conductors shown in FIGS. 11A-24B may be used to deliver power from a power source to a power load, such as an electrical motor and/or any other suitable power load. The current sensors that are disposed inside the conductors may be used to measure the current through the conductors and their output may be utilized in various automated control algorithms that are used to operate the power load.

Figure 12A:
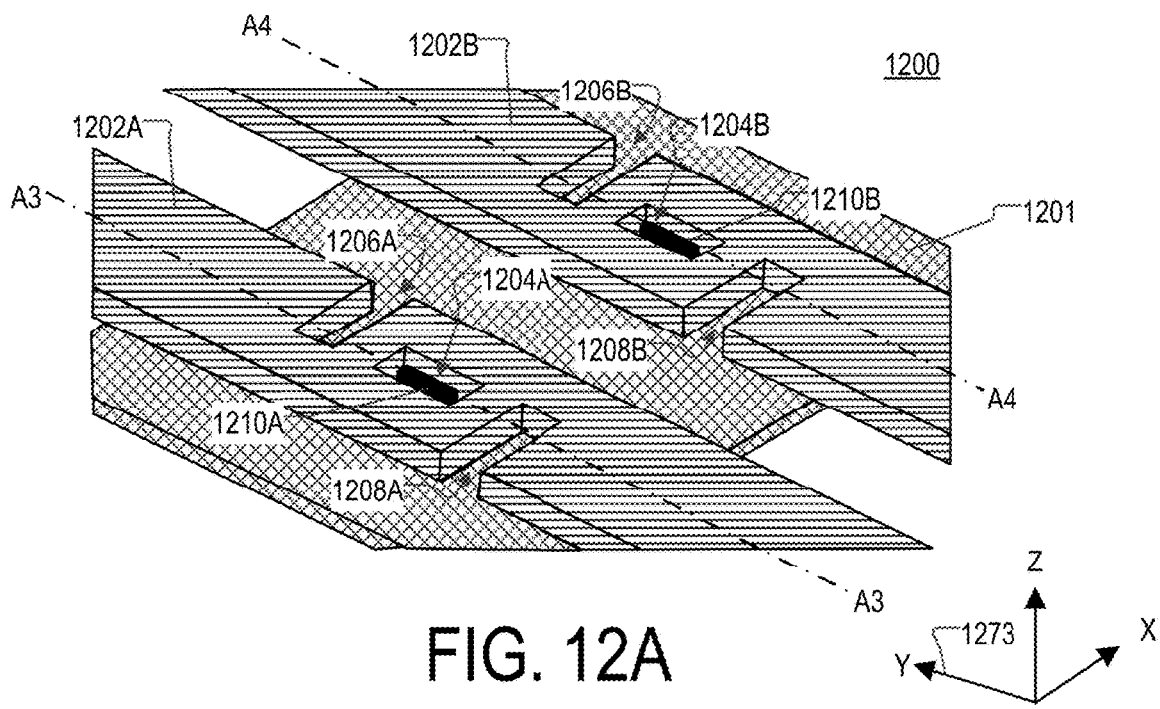
FIG. 12A is perspective view of an example of a system, according to aspects of the disclosure.

FIG. 12A is a diagram of an example of a system 1200, according to aspects of the disclosure. As illustrated, system 1200 may include a printed circuit board 1201, a conductor 1202A, and a conductor 1202B. Conductor 1202A may include notches 1206A and 1208A, and a through-hole 1204A. In one implementation, each of notches 1206A and 1208A may be a void that is formed in one of the sides of conductor 1202A by removing material from conductor 1202A (e.g., by cutting or stamping out portions of conductor 1202A, etc.). The through-hole 1204A may be situated between the notches 1206A and 1208A, as shown. Inside the through-hole 1204A, a current sensor 1210A may be positioned. The current sensor 1210A may be arranged to measure the level of electrical current through conductor 1202A. The current sensor 1210A may be coupled to one or more conductive traces in the printed circuit board 1201 and arranged to send and receive signals via the conductive traces. Each of the current sensors 1210A-B may be the same or similar to the current sensor 110, which is discussed above with respect to FIG. 2.

Conductor 1202B may include notches 1206B and 1208B, and a through-hole 1204B. In one implementation, each of notches 1206B and 1208B may be a void that is formed in one of the sides of conductor 1202B by removing material from conductor 1202B (e.g., by cutting or stamping out portions of conductor 1202A, etc.). The through-hole 1204B may be situated between the notches 1206A and 1208A, as shown. Inside the through-hole 1204B, a current sensor 1210B may be positioned. The current sensor 1210B may be arranged to measure the level of electrical current through conductor 1202B. The current sensor 1210B may be coupled to one or more conductive traces in the printed circuit board 1201 and arranged to send and receive signals via the conductive traces.

In some implementations, each (or at least one of) conductor(s) 1202A and 1202B may be fully embedded or integrated into the printed circuit board 1201. Additionally or alternatively, in some implementations, each (or at least one of) conductor(s) 1202A and 1202B may be partially embedded or integrated into the printed circuit board 1201. Additionally or alternatively, in some implementations, each (or at least one of) conductor(s) 1202A and 1202B may be disposed above or below the printed circuit board 1201. In such implementations, an air gap may be provided between the conductors(s) 1202A and/or 1202B or the conductors 1202A and/or 1202B may be affixed to the printed circuit board 1201 via a layer of adhesive material that doubles as an electrical isolator.

According to the present example, each of the current sensors 1210A-B has an axis of maximum sensitivity that is substantially parallel to the Z-axis of coordinate system 1273 (e.g., an axis of maximum sensitivity that is substantially perpendicular to the printed circuit board 1201). In the example of FIG. 12A, each of the current sensors 1210A-B is provided in a system-in-package (SIP) package. However, if the through-holes 1204A-B are made large enough, it is possible to provide the current sensors 1210A-B in a surface mount package (for as long as the axes of the sensing elements in the current sensors 1210A-B are substantially parallel to the Z-axis of coordinate system 1273). As can be readily appreciated, a SIP package would use a magnetic technology that has in-plane sensitivity (e.g., vertical Hall, TMR, etc.) while a surface mount package would require a magnetic technology sensitive in a perpendicular direction (e.g., planar Hall, magnetic flux concentrator+TMR etc.)

Figure 12B:
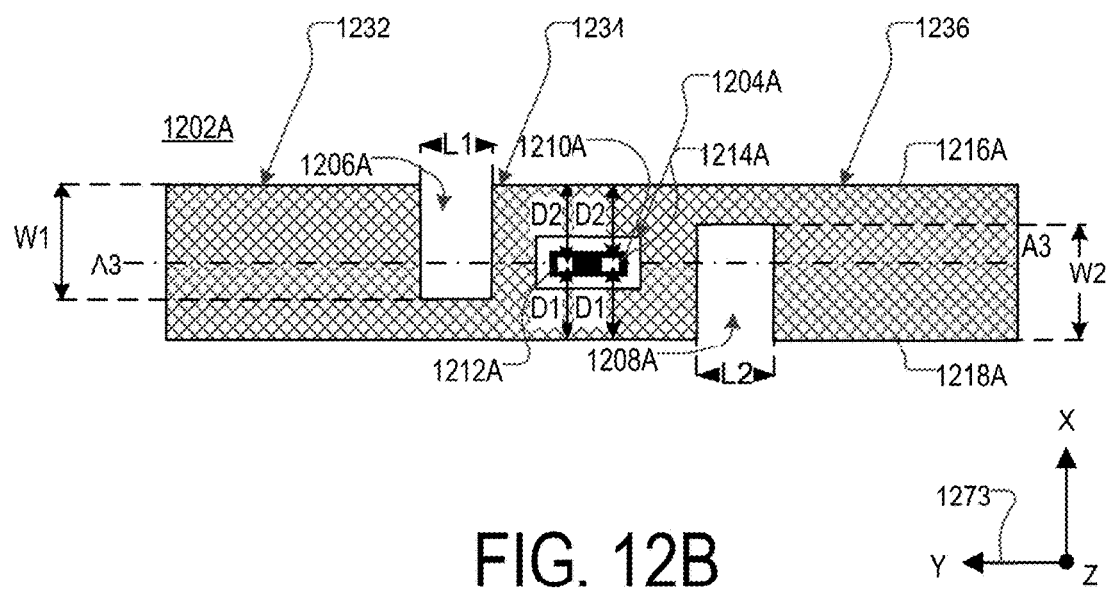
FIG. 12B is a planar top-down view of an example of a conductor, according to aspects of the disclosure.

FIG. 12B is a planar top-down view of conductor 1202A, according to aspects of the disclosure. As illustrated, conductor 1202A may have a central longitudinal axis A3-A3. The notch 1206A may have a length L1 and a width W1. The notch 1208A may have a length L2 and a width W2. The current sensor 1210A may include magnetic field sensing elements 1212A and 1214A. According to the present example, the magnetic field sensing elements 1212A and 1214A are aligned with the central longitudinal axis A3-A3. The distance from the center of magnetic field sensing element 1212A to edge 1216A of conductor 1202A is D2. The distance from the center of magnetic field sensing element 1212A to edge 1218A of conductor 1202A is D1. The distance from the center of magnetic field sensing element 1214A to edge 1216A of conductor 1202A is D2. The distance from the center of magnetic field sensing element 1214A to edge 1218A of conductor 1202A is D1.

According to the present example, the distance D1 is equal to the distance D2. However, alternative implementations are possible in which the magnetic field sensing elements 1212A and 1214A are not centered on the central longitudinal axis A3-A3, in which case the distance D1 may be different from the distance D2. According to the present example, the width W1 is such that the notch 1206A extends past the central longitudinal axis A3-A3 (i.e., W1>D2). However, alternative implementations are possible in which the notch 1206A stops at the central longitudinal axis A3-A3 (i.e., W1=D2) or in which notch 1206A stops before the central longitudinal axis A3-A3 (i.e., W1<D2). According to the present example, the width W2 is such that the notch 1208A extends past the central longitudinal axis A3-A3 (i.e., W2>D1). However, alternative implementations are possible in which the notch 1208A stops at the central longitudinal axis A3-A3 (i.e., W1=D2) or in which notch 1208A stops before the central longitudinal axis A3-A3 (i.e., W2<D1). According to the present example, the width W1 is equal to the width W2. However, alternative implementations are possible in which the widths W1 and W2 are different. According to the present example, the length L1 is equal to the length L2. However, alternative implementations are possible in which the lengths L1 and L2 are different.

Figure 12C:
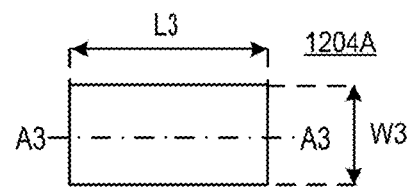
FIG. 12C is a diagram of an example of a through-hole of a conductor, according to aspects of the disclosure.

FIG. 12C is a diagram of the through-hole 1204A. As illustrated, the through-hole 1204A may have a length L3 and a width W3. According to the present disclosure, the length L3 is greater than the width W3, so that the through-hole 1204A has an elongated shape that extends lengthwise in the conductor 1202A. However, alternative implementations are possible in which the length L3 is equal to the width W3 or is smaller than the width W3. According to the present example, the length L3 is greater than the lengths L1 and L2. However, alternative implementations are possible in which the length L3 is smaller than or equal to at least one of the lengths L1 and L2. According to the present example, the width W3 is smaller than the widths W1 and W2. However, alternative implementations are possible in which the width W3 is greater than or equal to at least one of the widths W1 and W2.

Figure 12D:
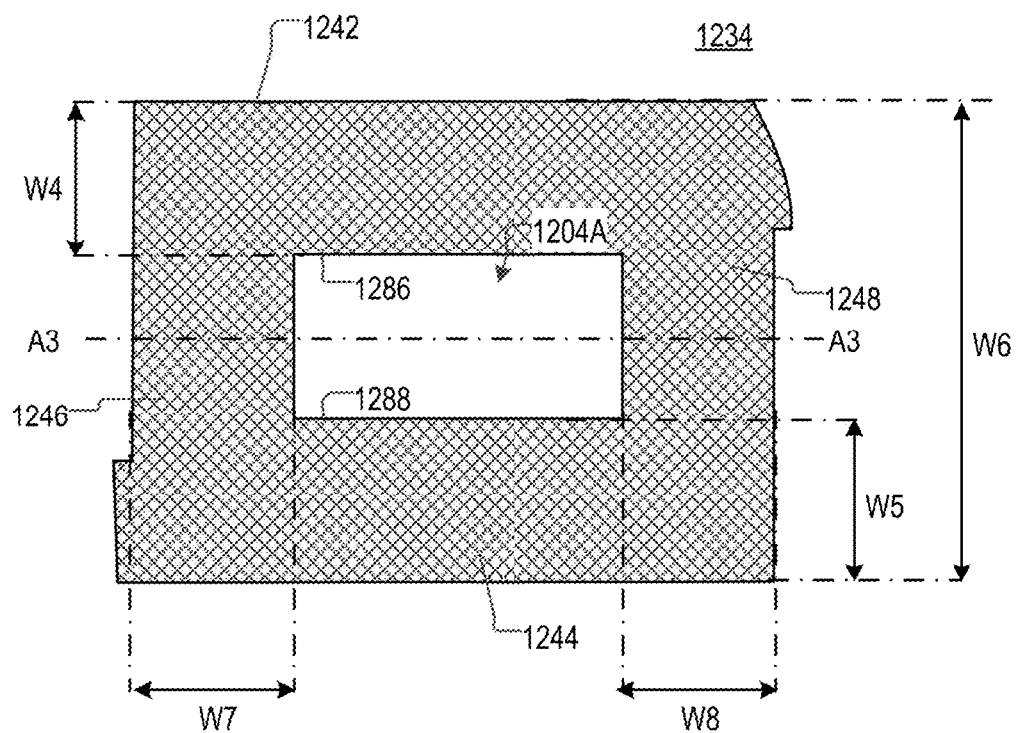
FIG. 12D is a planar view of a portion of the conductor of FIG. 12B, according to aspects of the disclosure.

In one respect, notches 1206A and 1208A divide conductor 1202A into portions 1232, 1234, and 1236 (shown in FIG. 12B). FIG. 12D, shows portion 1234 in further detail. As illustrated, portion 1234 may include a leg 1242 and a leg 1244. Leg 1242 may have a width W4 and leg 1244 may have a width W5. As can be readily appreciated, each of the widths W4 and W5 is smaller than the full width W6 of conductor 1202A. According to the present example, widths W4 and W5 are equal. However alternative implementations are possible in which width W4 is smaller or greater than the width W5. Furthermore, portion 1234 may include legs 1246 and 1248. Leg 1246 may have a width W7 and leg 1248 may have a width W8. According to the present example, width W7 is the same as width W8, however alternative implementations are possible in which width W7 is greater than or is smaller than width W8. According to the present example, width W7 is the same as widths W4 and W5. However, alternative implementations are possible in which width W7 is smaller or greater than at least one of widths W4 and W5. In some implementations making the legs 1246 and 1248 narrow (i.e., using small widths W7 and W8) focuses the electrical current through the conductor 1202A in a small section of the conductor 1202A thus increasing the current density close to the sensor 1210A, which is placed in the aperture 1204A of the conductor 1202A. This results in a larger magnetic field being generated by the current, which in turn results in increased accuracy of the sensor 1210.

In the example of FIG. 12D, the through-hole 1204A is shaped as a rectangle, and includes edges 1286 and 1288 that are substantially parallel to the central longitudinal axis A3-A3. However, alternative implementations are possible in which the edges 1286-1288 are oriented at an angle relative to the central longitudinal axis A3-A3. In such implementations, the through-hole 1204A may be shaped as a rectangle or another type of parallelogram. In some implementations, the angle between each of edges 1286 and 1288 and axis A3-A3 may be in the range of 30-75 degrees. Additionally, or alternatively, in some implementations, the angle may be substantially equal to 45 degrees. Although in the example of FIG. 12D the through-hole 1204A is shaped as a rectangle, the present disclosure is not limited to any specific shape for the through-hole 1204A. For example, in some implementations, the through-hole may be shaped as an oval, a circle, a trapezoid, a parallelogram, a polygon, etc.

Figure 12E:
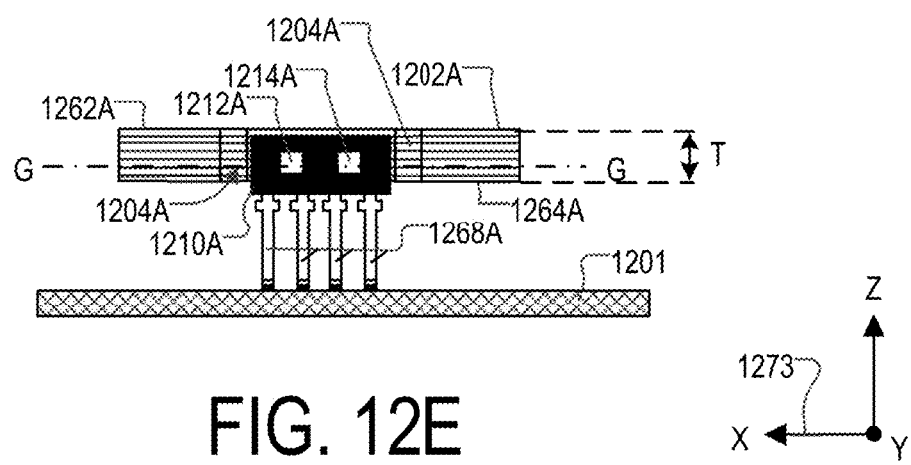
FIG. 12E is a partial cross-sectional view of the system of FIG. 12A, according to aspects of the disclosure.

FIG. 12E shows a cross-sectional side view of the conductor 1202A, according to aspects of the disclosure. As illustrated, the current sensor 1210A may include terminals 1268A. Each of terminals 1268A may be coupled to a respective conductive trace that is part of the printed circuit board 1201 (not shown). Furthermore, as illustrated, the magnetic field sensing elements 1212A and 1214A may be disposed inside the through-hole 1204A, such that magnetic field sensing elements 1212A and 1214 are situated below a top (and/or main) surface 1262A of conductor 1202A and above a bottom (and/or main) surface 1264A of conductor 1202A. As noted above, each of the magnetic field sensing elements 1212A and 1214A may have a respective axis of maximum sensitivity that is substantially parallel to the Z-axis of coordinate system 1273.

In the example of FIG. 12E, the magnetic field sensing elements 1212A and 1214A are aligned with an alignment axis G-G. According to the present example, the alignment axis is coincidental with the central longitudinal axis A3-A3 (i.e., it is the same axis). However, alternative implementations are possible in which the alignment axis G-G is different, but parallel, to the central longitudinal axis A3-A3; in such implementations, the alignment axis G-G may be a longitudinal axis of the conductor 1202A, other than a central longitudinal axis. Alternatively, in some implementations, the alignment axis G-G may be oriented at an angle relative to the central longitudinal axis A3-A3. In such implementations, the angle may be in the range of 30-75 degrees, etc. Additionally or alternatively, in some implementations, the angle may be substantially equal to 45 degrees.

In a preferred implementation, the alignment axis G-G may be substantially parallel to the central longitudinal axis A4-A4 of conductor 1202A (shown in FIG. 12A) irrespective of whether the central longitudinal axes A3-A3 and A4-A4 are substantially parallel to one another. As is discussed further below, making the alignment axis G-G parallel to the central longitudinal axis A4-A4 of conductor 1202B would make sensing elements 1212A and 1214A equidistant from conductor 1202B, which in turn may reduce, or ideally eliminate, crosstalk between conductor 1202B and the sensor 1010A. In some implementations, the conductor 1202A may have a thickness T in the range of 1-10 mm. However, the present disclosure is not limited to any specific thickness for the conductor 1202A.

Figure 12F:
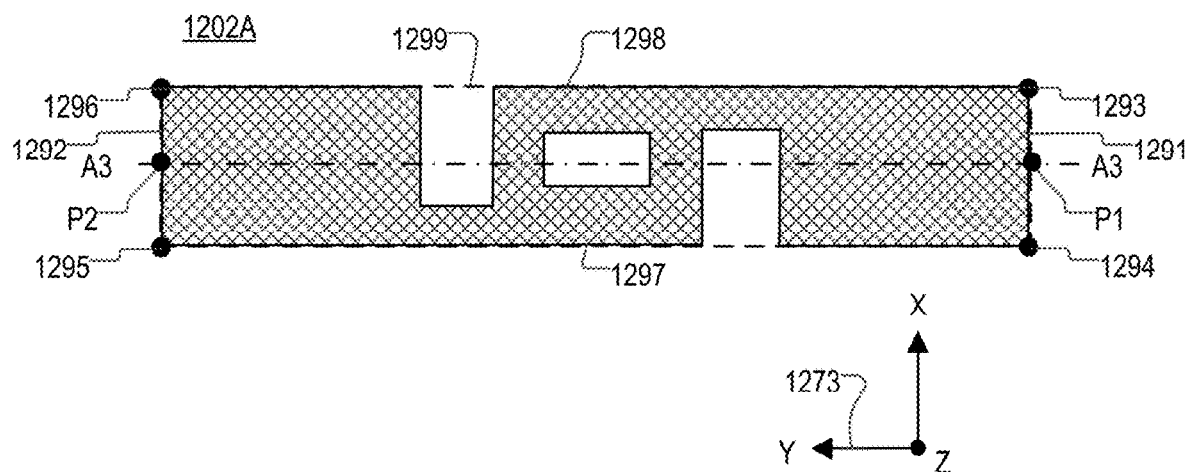
FIG. 12F is a planar top-down view of an example of a conductor, according to aspects of the disclosure.

FIG. 12F shows a planar top-down view of the conductor 1202A. When the conductor 1202A is in use, electrical current may flow from end 1291 to end 1292. End 1291 may extend between end-corners 1293 and 1294 of conductor 1202A. End 1292 may extend between end corners 1295 and 1296. Together, end-corners 1293-1296 define a rectangle 1299. The central longitudinal axis A3-A3 may intersect end 1291 at point P1, which is equidistant from end-corners 1293 and 1294. The central longitudinal axis A3-A3 may intersect end 1292 at point P2, which is equidistant from end corners 1295 and 1296. Under the nomenclature of the present disclosure, the central longitudinal axis of a conductor extends in the direction of the flow of current through the conductor and it intersects the conductor at a location that is equidistant from adjacent end corners of the conductor. By contrast, a longitudinal axis of the conductor may be parallel to the central longitudinal axis, but it may or may not intersect the conductor at locations that are equidistant from adjacent end corners of the conductor. According to the present example, the general outline of side-edge 1298 of the conductor 1202A, as illustrated by a dashed line representing the side of rectangle 1299, is parallel to the central longitudinal axis A3-A3. According to the present example, the general outline of side-edge 1297 of the conductor 1202A, as illustrated by another dashed line represented the side of rectangle 1299, is parallel to the central longitudinal axis A3-A3.

In the example of FIG. 12A-E, the magnetic field sensing elements 1212A and 1214A may be aligned with the central longitudinal axis A3-A3 of the conductor 1202A. The central longitudinal axis A3-A3 of conductor 1202A is substantially parallel to the central longitudinal axis A4-A4 of conductor 1202B and/or the side edges of conductor 1202B. As a result of this arrangement, the magnetic field sensing elements 1212A and 1214A are spaced apart by the same distance from conductor 1202B. This causes magnetic field sensing elements 1212A and 1214A to be subjected to same magnetic field (or magnetic flux) originating from conductor 1202B. When one of magnetic field sensing elements 1212A and 1214A is subjected to the same magnetic field (or magnetic flux density) as the other one of magnetic field sensing elements 1212A and 1214A, no crosstalk will occur between conductor 1202B and current sensor 1210A. This is because the output of current sensor 1210A is based on the difference between the output of magnetic field sensing elements 1212A and 1214A, and the offset that is imparted by conductor 1202B on the outputs of magnetic field sensing elements 1212A and 1214A would be cancelled out when the difference between the outputs is calculated. (E.g., see equation 1 above and the discussion of ΔB, in particular, etc.)

According to the present disclosure, the phrase "a pair of magnetic field sensing elements are aligned with a given axis" shall mean that each of the magnetic field sensing elements is disposed on the axis, directly above the axis, or directly below the axis, when the axis lies in the X-Y plane of coordinate system 1273. It will be appreciated that under this definition, the pair of magnetic field elements would be considered aligned with the axis even if one of the magnetic field sensing elements is disposed on the axis and the other one is disposed above or below the axis, etc. As used throughout the disclosure, the phrase "substantially equal to X degrees" (where X is an integer) shall mean within +/−10 degrees of X. As used throughout the disclosure, the phrase substantially parallel shall mean "within +/−10 degrees of being exactly parallel." As used throughout the disclosure, the phrase "substantially perpendicular" shall mean within +/−10 degrees of being exactly perpendicular.

Although in the example of FIGS. 12A-F the notches 1206A and 1208A each have a rectangular shape, the present disclosure is not limited thereto. For example, in some implementations, at least one of the notches 1206A and 1208A may have a triangular shape, an oval shape, a trapezoidal shape, a curved shape, and/or any other suitable type of shape. Although in the example of FIGS. 12A-F each of the notches 12A-F has sharp corners, alternative implementations are possible in which at least one of the notches 12A-F has rounded corners. Although in the example of FIGS. 12A-F the conductor 1202A-F includes two notches (i.e., notches 1206A and 1208A), alternative implementations are possible in which the conductor 1202A includes only one notch or more than two notches, etc.

FIGS. 12A-F show an example of one possible implementation of conductor 1202A. However, it will be understood that conductor 1202B may have identical or similar configuration to that of conductor 1202A. Similarly, it will be understood that the current sensor 1210B may identical configuration to that of current sensor 1210A. Furthermore, the current sensor 1210B (or its magnetic field sensing elements) may have the same or similar positioning (or orientation) relative the conductor 1202B as the sensor 1210A has relative to conductor 1202A. In this regard, it will be understood that the concepts and ideas that are expressed with respect to the configuration of conductor 1202A apply in equal force to conductor 1202B, as well. Similarly, the concepts and ideas that are expressed with respect to the configuration and orientation of current sensor 1210A apply in equal force to current sensor 1210B, as well. Furthermore, it will be understood that FIGS. 12A-D show an example of one possible implementation of conductor 1202A. The discussion that follows with respect to FIGS. 13-16 provides examples of different variations that can be applied to the implementation of conductor 1202A that is presented in FIGS. 12A-F.

Figure 13A:
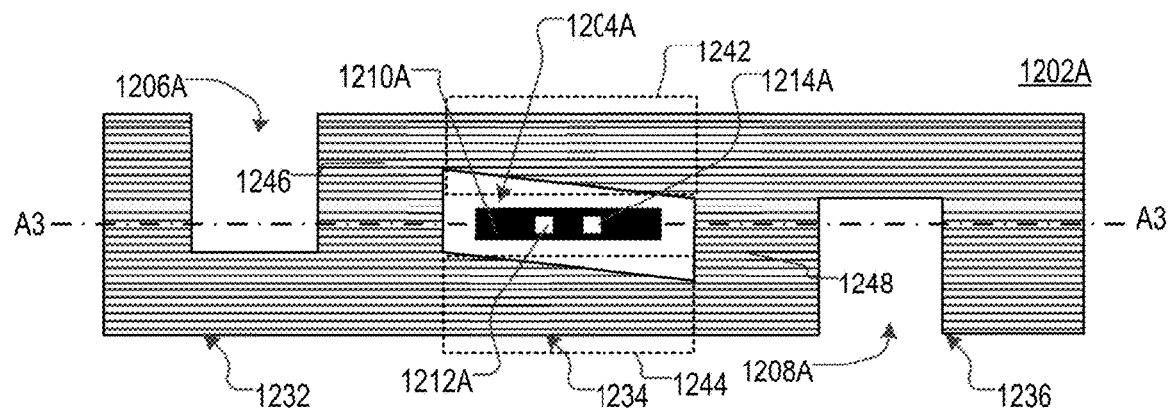
FIG. 13A is a planar top-down view of an example of a conductor and current sensor, according to aspects of the disclosure.

FIG. 13A shows the conductor 1202A in accordance with another implementation. In the implementation of FIG. 13A, the through-hole 1204A is shaped as a parallelogram. As a result of this arrangement, legs 1242 and 1244 each have a trapezoidal shape, while legs 1246 and 1248 each have a rectangular shape. In the example of FIG. 13A, magnetic field sensing elements 1212A and 1214A are disposed on the central longitudinal axis A3-A3 of the conductor 1202A.

Figure 13B:
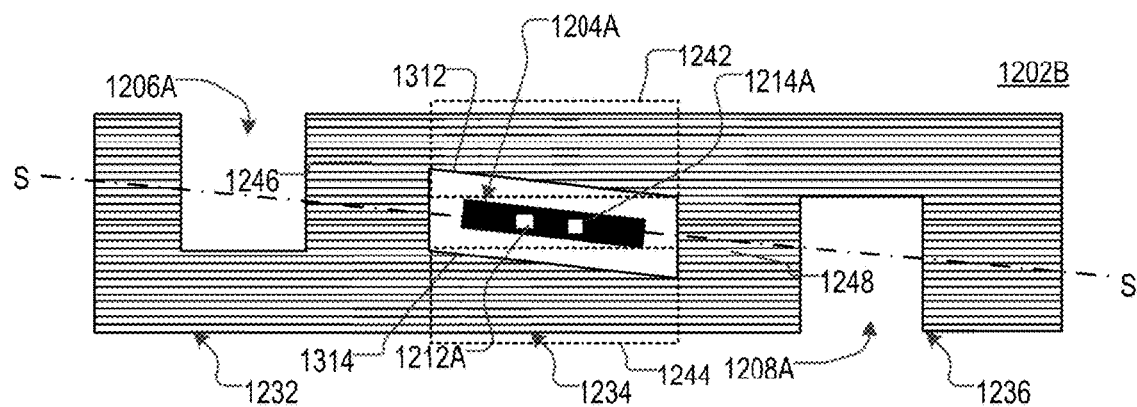
FIG. 13B is a planar top-down view of an example of a conductor and current sensor, according to aspects of the disclosure.

FIG. 13B shows the conductor 1202A in accordance with yet another implementation. In the implementation of FIG. 13B, the through-hole 1204A is shaped as a parallelogram. As a result of this arrangement, legs 1242 and 1244 each have a trapezoidal shape, while legs 1246 and 1248 each have a rectangular shape. In the example of FIG. 13B, magnetic field sensing elements 1212A and 1214A are disposed on axis S-S, which runs substantially in parallel to edges 1312 and 1314 of the through-hole 1204A. According to the present example, axis S-S is equidistant from edges 1312 and 1314. However, alternative implementations are possible in which axis S-S is closer to one of edges 1312 and 1314 than the other.

Figure 14:
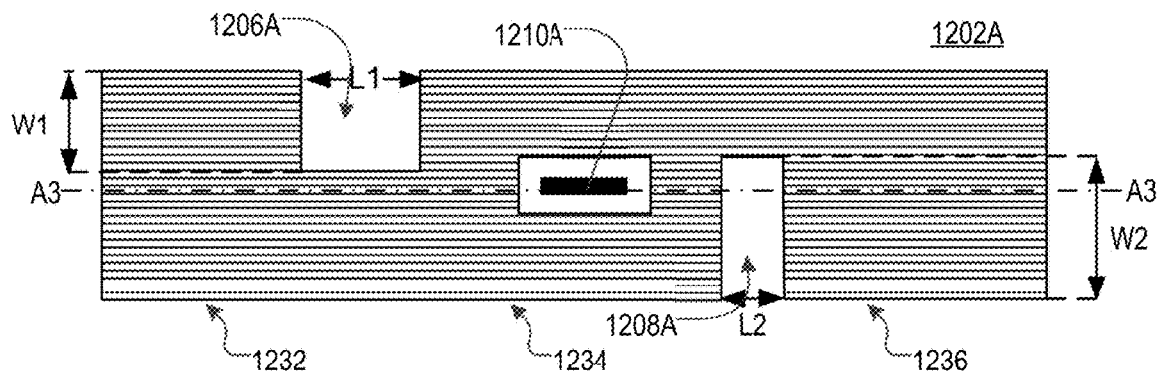
FIG. 14 is a planar top-down view of an example of a conductor and current sensor, according to aspects of the disclosure.

FIG. 14 shows the conductor 1202A in accordance with yet another implementation. In the example of FIG. 14, the length L1 of notch 1206A is greater than the length L2. Furthermore, the width W2 of notch 1208A is greater than the width W1 of notch 1206A.

Figure 15A:
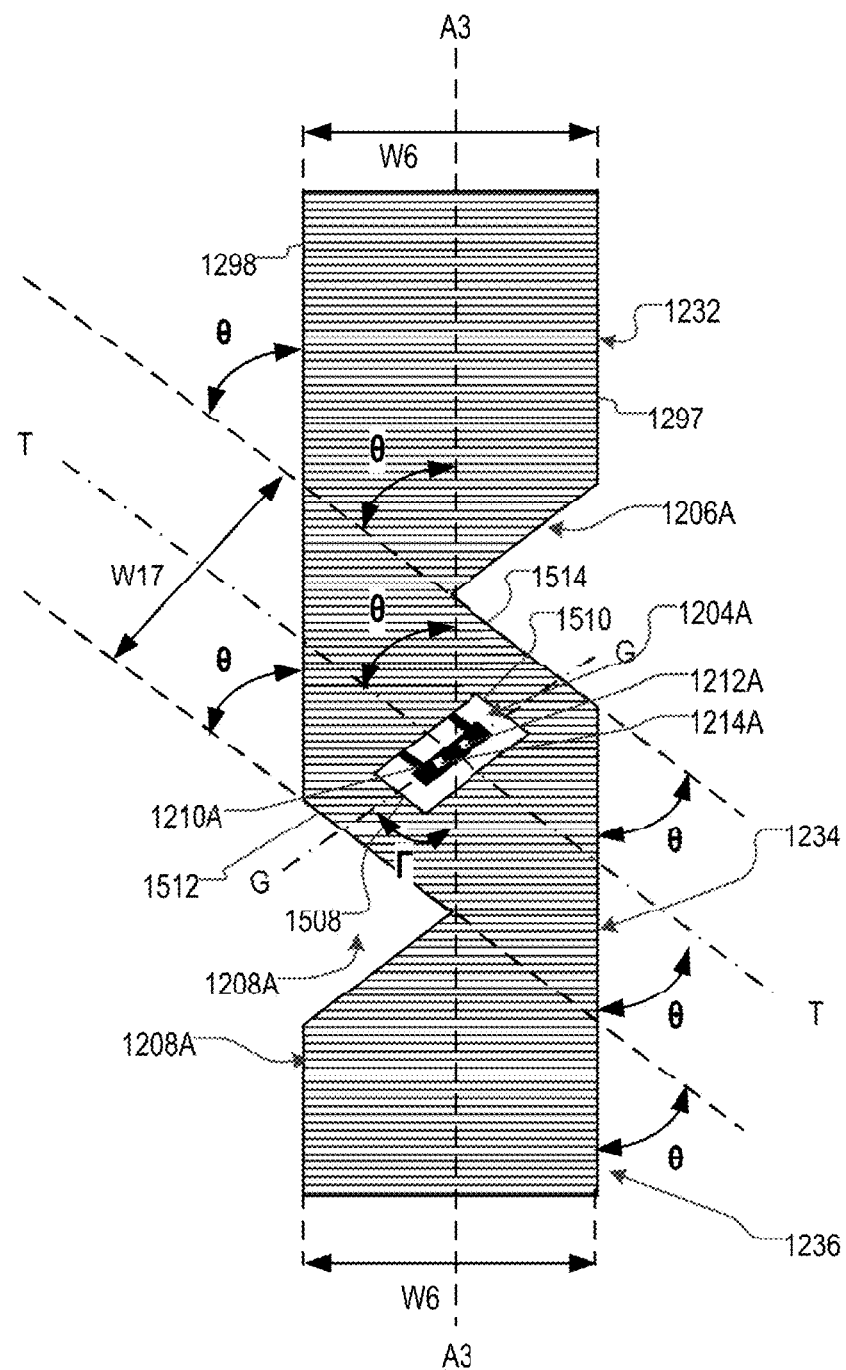
FIG. 15A is a planar top-down view of an example of a conductor and current sensor, according to aspects of the disclosure.
Figure 15B:
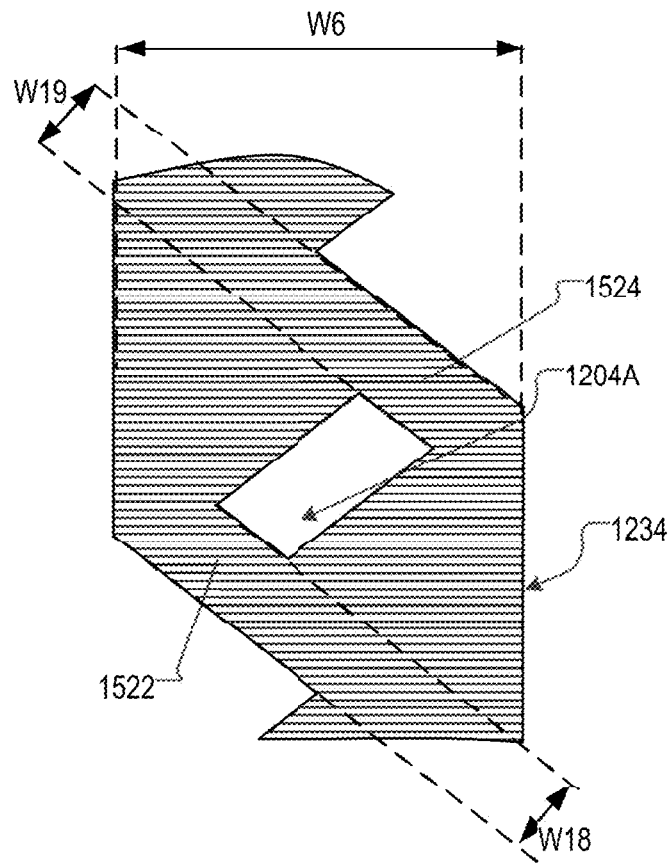
FIG. 15B is a partial view of the conductor of FIG. 15A, according to aspects of the disclosure.

FIGS. 15A-B show the conductor 1202A in accordance with yet another implementation. In the implementation of FIGS. 15A-B, notches 1208A and 1206A are shaped in such a way so as to cause portion 1234 to extend at an angle relative to portions 1232 and 1236. According to the example of FIG. 15, notches 1206A and 1208A each have a triangular shape. However, the present disclosure is not limited to notches 1206A and 1208A having any specific shape. According to the present example, portion 1234 has an axis T-T that is arranged at an angle θ relative to the central longitudinal axis A3-A3 of conductor 1202A. Edge 1508 of through-hole 1204A may be substantially parallel to edge 1512 of notch 1208A. Edge 1510 of through-hole 1204A may be substantially parallel to edge 1514 of notch 1206A. Edges 1508 and 1510 may both be substantially parallel to the central axis T-T. Magnetic field sensing elements 1212A and 1214A of current sensor 1210A may be aligned with an axis G-G. According to the present example, axis G-G is perpendicular to the central axis T-T. However, alternative implementations are possible in which axis G-G is orientated relative to axis T-T at an angle other than 90 degrees. According to the present example, the axis G-G is arranged at an angle Γ relative to axis A3-A3. In some implementations, the angle Γ may be less than 75 degrees or in the range of 30-75 degrees. Furthermore, alternative implementations are possible in which magnetic field sensing elements 1212A and 1214A are aligned on the central longitudinal axis A3-A3. As illustrated, portion 1234 may have a width W17. According to the present example width W17 is greater than the full width W6 of conductor 1202A. However, alternative implementations are possible in which the width W17 is smaller than or equal to the width W6. As illustrated in FIG. 15B, portion 1234 may have legs 1522 and 1524. Leg 1522 may have a width W18 and leg 1524 may have a width W19. According to the present example, widths W19 and W18 are smaller than the width W6 of the portions 1232 and 1236. Furthermore, according to the present example, widths W18 and W19 are equal. However, alternative implementations are possible in which the widths W18 and W19 are different. According to the present example, the angle θ is equal to 45 degrees. However, alternative implementations are possible in which the angle θ is less than 75 degrees or in the range of 30-75 degrees.

Unlike the example of FIGS. 12A-F, in the example of FIGS. 15A-B, the current sensor 1210A is not completely immune from cross-talk with conductor 1202B. However, because the current sensor 1210A is rotated by 45 degrees (from the 90-degree configuration of FIGS. 11A-B), the effects of crosstalk with conductor 1202B on the current sensor 1210A would still be reduced by 50%. At the same time, the orientation of current sensor 1210A that is shown in FIGS. 15A-B results in a higher magnetic flux being incident on magnetic field sensing elements 1212A and 1214A than the orientation of current sensor 1210A that is shown in FIGS. 12A-F. This in turn may positively affect the accuracy of the current sensor 1210A, under some circumstances. Stated succinctly, the configuration of FIGS. 11A-B has a high signal strength and a high cross-talk, the configuration of FIGS. 12A-F has a lower signal strength and low crosstalk, and the configuration of FIGS. 15A-B represents a compromise between the former two configurations by featuring higher signal strength that the configuration of FIGS. 12A-F and a lower cross-talk than the configuration of FIGS. 11A-B.

Figure 16:
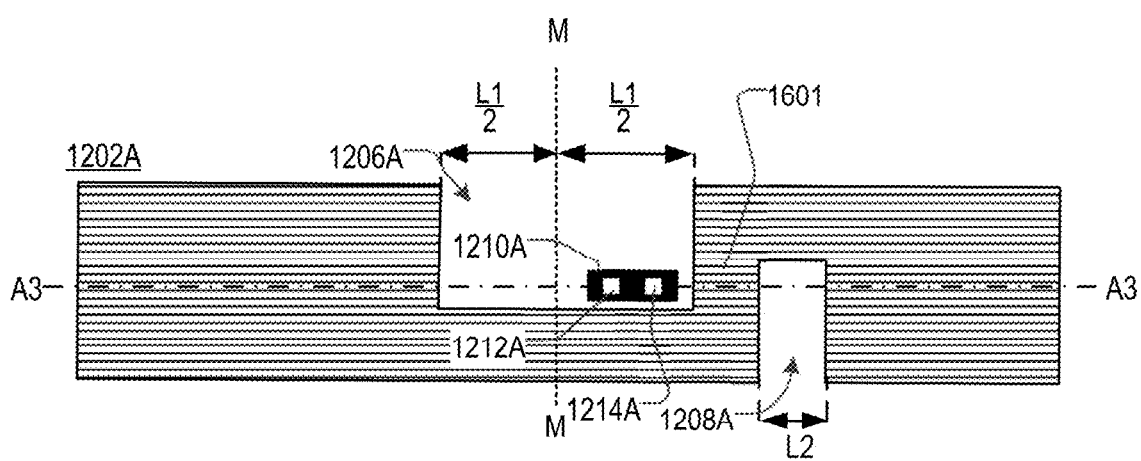
FIG. 16 is a planar top-down view of an example of a conductor and current sensor, according to aspects of the disclosure.

FIG. 16 shows the conductor 1202A in accordance with yet another implementation. In the implementation shown in FIG. 16, the through-hole 1204A is omitted from the conductor 1202A, and the current sensor 1210A is disposed in the notch 1206A. The notch 1206A may have an axis M-M that runs through its middle of notch 1206A and is perpendicular to the central longitudinal axis A3-A3. As illustrated, the current sensor 1210A may be disposed on the side of the axis M-M. However, it will be understood that alternative implementations are possible in which the current sensor 1210A is centered on the axis M-M, such that magnetic field sensing elements 1212A and 1214A are disposed on opposite sides of the axis M-M. The axis M-M may also be referred to as "the median axis" of notch 1206A. In one aspect, placing the sensor 1210A on the side of the median axis M-M is advantageous because it would bring the sensor 1210A closer to the source of the magnetic field that is being measured by the sensor 1210A. As a result, the sensor 1210A would be able to sense a larger field from the same amount of current. In the present case, the magnetic field source is leg 1601 of conductor 1202A.

Figure 17:
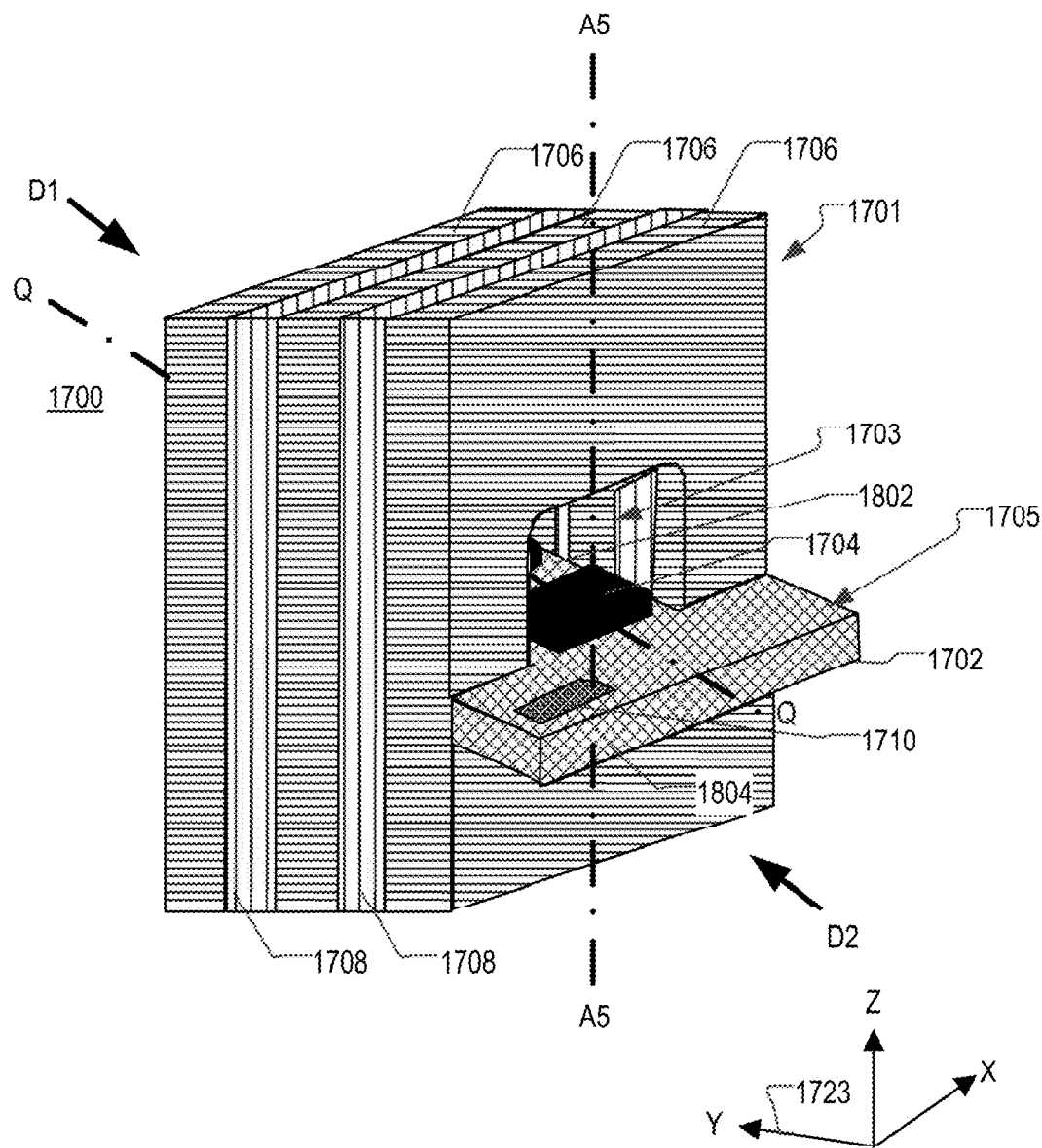
FIG. 17 is a perspective view of an example of a system, according to aspects of the disclosure.

FIG. 17 is a diagram of an example of a system 1700, according to aspects of the disclosure. As illustrated, the system 1700 may include a conductor assembly 1701 and a sensor assembly 1705 that is inserted in an aperture 1703 (e.g., a through-hole, etc.) that in the conductor assembly 1701. The conductor assembly 1701 may have a longitudinal axis A5-A5. The aperture 1703 may include a longitudinal axis Q-Q. The longitudinal axis Q-Q of the aperture may be substantially perpendicular to the longitudinal axis Q-Q. As illustrated, the conductor assembly may include a plurality of conductors 1706 that are spaced apart by layers of dielectric material 1708. According to the present example, the conductors 1706 are electrically isolated from one another by the layers of dielectric material 1708. However, in a preferred implementation, the layers of dielectric material may be omitted, while leaving an air gap between any two adjacent conductors 1706. In this regard, in the preferred implementations, the conductors 1706 may be electrically isolated from one another by air, rather than the provision of layers of dielectric material between them. The aperture 1703 may be formed by aligning respective through-holes that are formed in each of the conductors 1706.

The sensor assembly 1705 may include a printed circuit board 1702 and a plurality of current sensors 1704. Each of the current sensors 1704 may be the same or similar to the current sensor 110, which is discussed above with respect to FIG. 2. Each of the current sensors 1704 may have an axis of maximum sensitivity that is substantially parallel to central-longitudinal axis Q-Q of the aperture 1703. The axis of maximum sensitivity may be perpendicular to the central longitudinal axis A5-A5 of the conductor assembly 1701. The central longitudinal axis A5-A5 may be parallel to each (or at least one) of the central longitudinal axes of the individual conductors 1706 that make up the conductor assembly 1701. Each of the current sensors 1704 may be configured to measure the electrical current through a different one of the conductors 1706. Each of the current sensors 1704 may be coupled to one or more conductive traces (not shown) in the printed circuit board 1702. The printed circuit board 1702 may further include an interface 1710. The interface 1710 may include one or more terminals. Each of the terminals in the interface 1710 may be coupled to a respective one of the current sensors 1704 via a respective conductive trace that is formed in the printed circuit board 1702. The interface 1710 may be used by external circuitry to send and receive data from the current sensors 1704. In the example of FIG. 17, the central longitudinal axis A5-A5 may extend in parallel with the Z-axis of the coordinate system 1723, arm portion 1802 of printed circuit board 1702 extends in parallel with the Y-axis of the coordinate system 1723, and cross-portion 1804 of printed circuit board 1702 extends in parallel with the X-axis of the coordinate system 1723. The longitudinal axis Q-Q of the aperture 1703 may extend in parallel with the Y axis of the coordinate system 1723.

Figure 18:
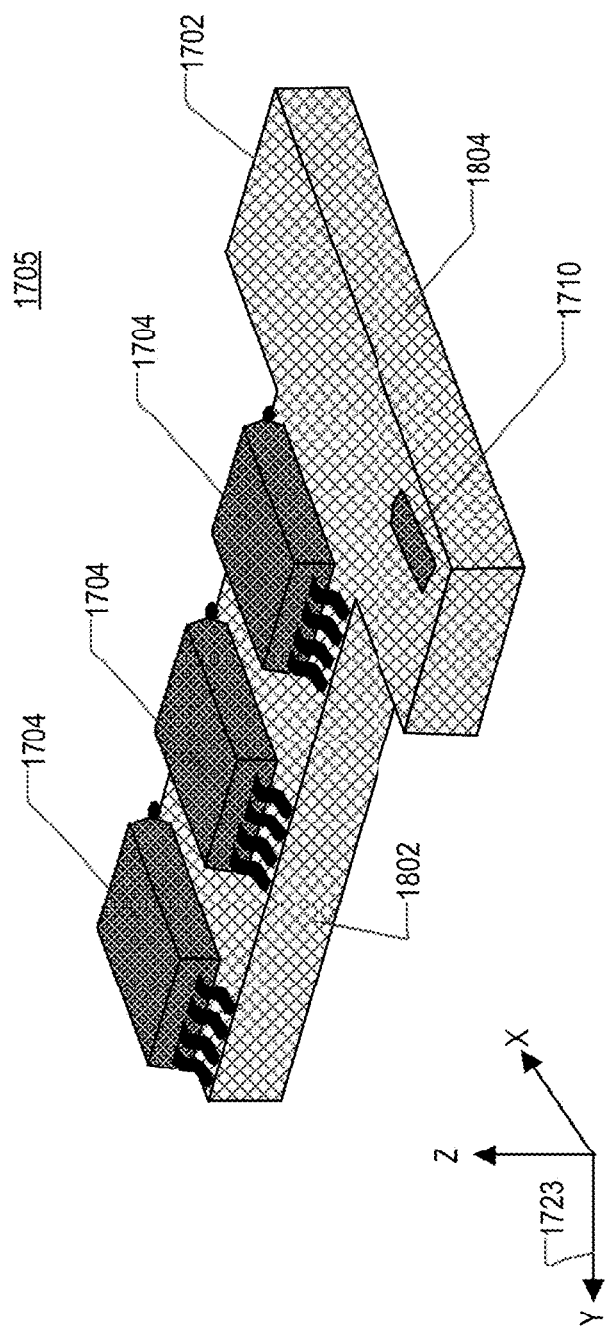
FIG. 18 is a perspective view of an example of a sensor assembly, according to aspects of the disclosure.

FIG. 18 is a perspective view of the sensor assembly 1705, according to aspects of the disclosure. As illustrated, the printed circuit board 1702 may be T-shaped, and as such, it may include an arm portion 1802 and a cross-portion 1804. As noted above, when the sensor assembly 1705 is installed in the system 1700, the arm portion 1802 may be inserted in the aperture 1703 of the conductor assembly 1701, while the cross-portion 1804 engages an exterior surface of the conductor assembly 1701 so as to prevent the sensor assembly 1705 from sinking any further into the aperture 1703. In some implementations, the printed circuit board 1702 may be so dimensioned as to ensure that when the cross-portion 1804 comes in contact with the conductor assembly 1701, each of the current sensors 1704 would be situated in the respective through-hole 2202 (shown in FIG. 22) of a different one of the conductors 1706. In other words, the arm portion 1802 and cross-portion 1804 of the printed circuit board 1702 may be so dimensioned as to ensure a proper alignment between the current sensors 1704 and the conductors 1706.

Figure 19A:
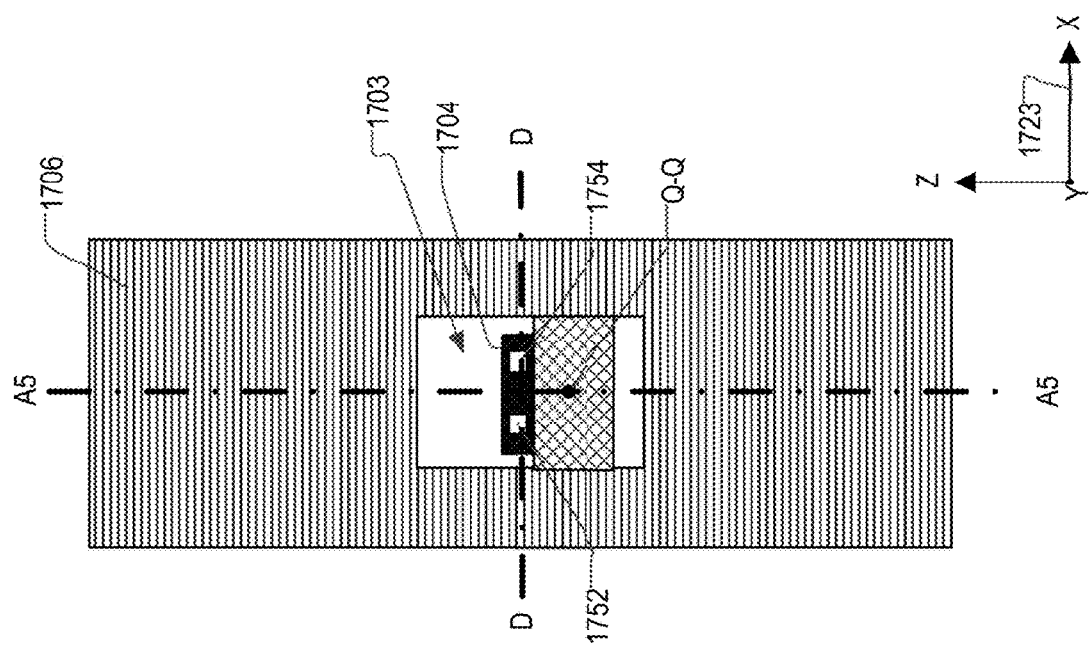
FIG. 19A is a planar side view of the system of FIG. 17, according to aspects of the disclosure.
Figure 19B:
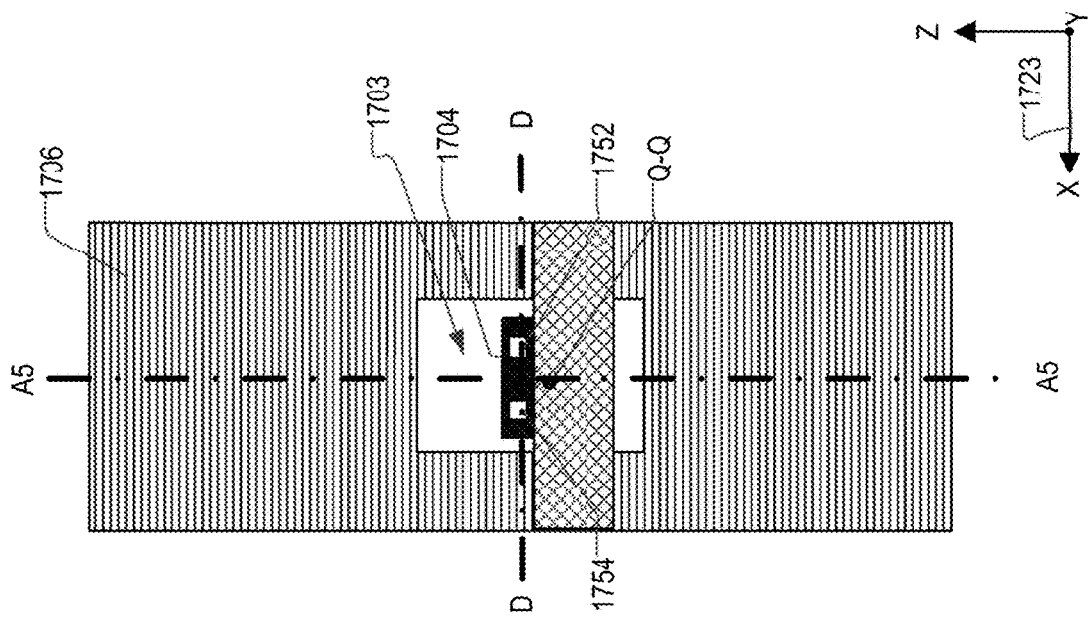
FIG. 19B is a planar side view of the system of FIG. 17, according to aspects of the disclosure.

FIG. 19A is a planar side view of the system 1700 when viewed from direction D1 (shown in FIG. 17). FIG. 19B is a planar side view of the system 1700 when viewed from direction D2 (shown in FIG. 17). Together, FIGS. 19A-B illustrate that in some implementations the aperture 1703 may be a through hole. In another aspect, FIGS. 19A-B illustrate that each of current sensors 1704 may include magnetic field sensing elements 1752 and 1754 that are situated on opposite sides of the central longitudinal axis A5-A5. As noted above, each of magnetic field sensing elements 1752 and 1754 may have a respective axis of maximum sensitivity that is substantially perpendicular to the central longitudinal axis A5-A5. Additionally or alternatively, the axis of maximum sensitivity of each of the magnetic field sensing elements 1752 and 1754 may extend in parallel to the longitudinal axis Q-Q of the aperture 1703. Although in the present example, the axis Q-Q is perpendicular to the axis A5-A5, alternative implementations are possible in which the axis Q-Q is oriented at a different angle relative to the axis A5-A5.

In another aspect, the sensing elements 1754 and 1752 of each current sensor 1704 may be aligned with a different respective axis D-D. Each respective axis D-D may be perpendicular to the central longitudinal axes A5-A5 of all conductors 1706 in the conductor assembly 1701. Each respective axis D-D may be perpendicular to the longitudinal axis Q-Q of the aperture 1703.

As a result of this arrangement, the sensing elements 1754 and 1752 in the current sensor 1704 that is disposed in any given one of conductors 1706 may be equidistant from all remaining conductors 1706 in the conductor assembly 1701. As discussed above, this may in turn limit the amount of crosstalk between the current sensor 1704 and the remaining conductors 1706.

Figure 20A:
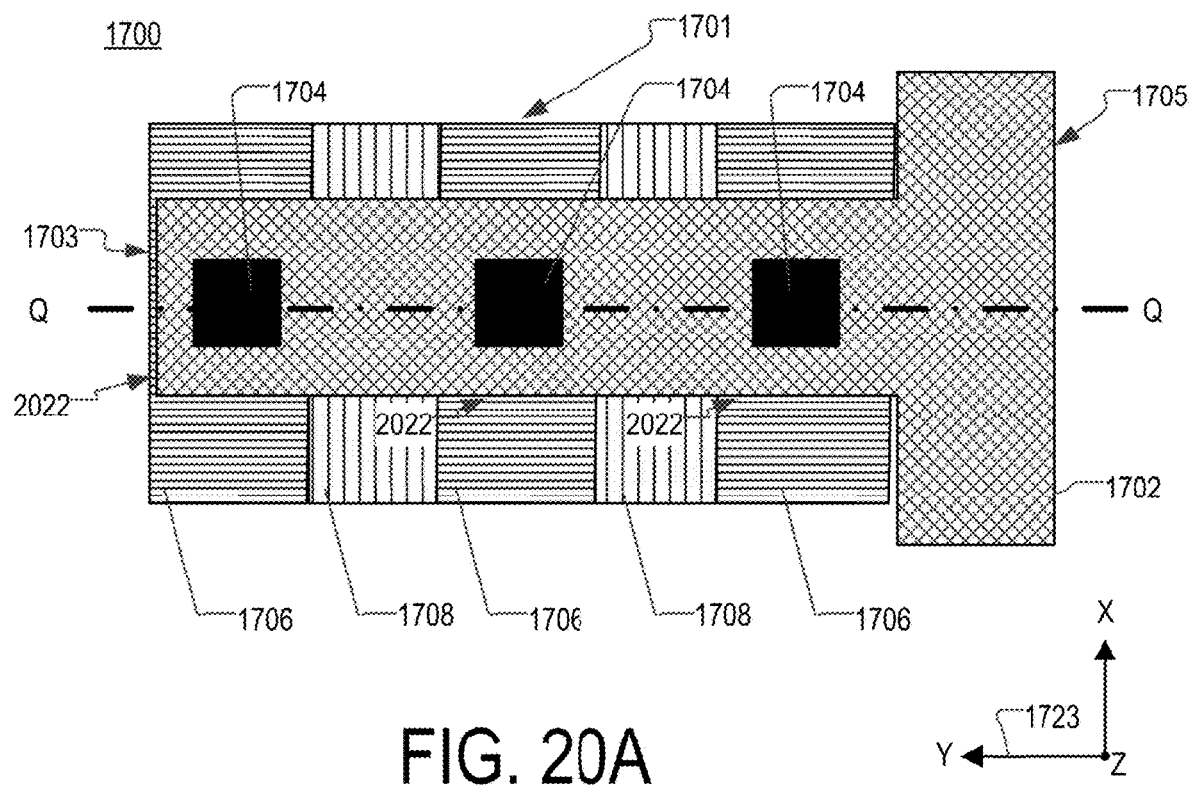
FIG. 20A is a cross-sectional view of the system of FIG. 17, according to aspects of the disclosure.

FIG. 20A is a cross-sectional top-down view of the system 1700 that is taken along an axis Q-Q (shown in FIG. 17). FIG. 20 illustrates that when the sensor assembly 1705 is inserted in the aperture 1703, each of the current sensors 1704 may be disposed (at least in part) inside the respective through-hole 2202 of a different one of the conductors 1706.

Figure 20B:
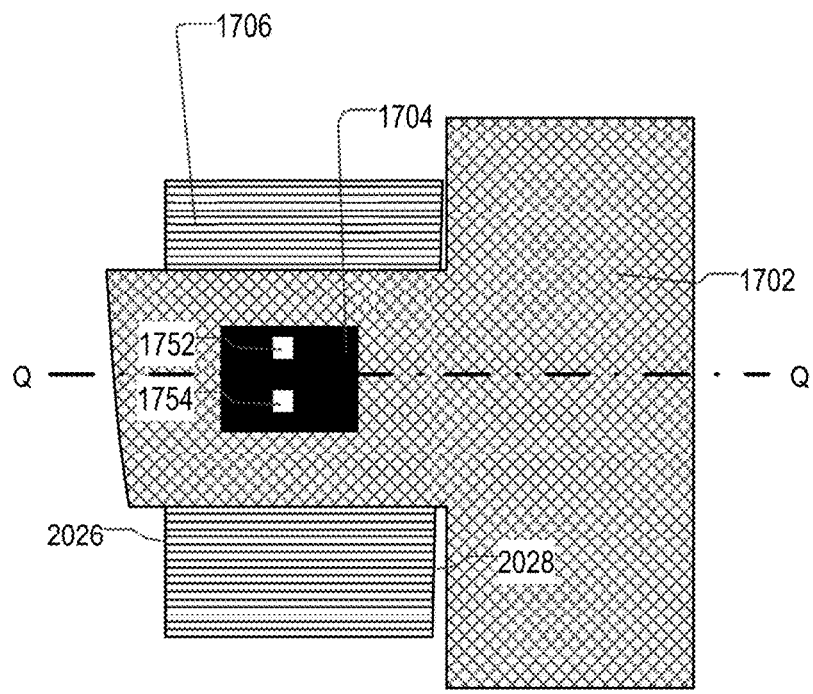
FIG. 20B is a partial cross-sectional view of the system of FIG. 17, according to aspects of the disclosure.

FIG. 20B is a partial cross-sectional top-down view of the system 1700 that is taken along an axis Q-Q (shown in FIG. 17). FIG. 20B illustrates that each of the conductors 1706 may have main surfaces 2026 and 2028 and each of the current sensors 1704 may include magnetic field sensing elements 1752 and 1754. According to the present example, magnetic field sensing elements are disposed between the main surfaces 2026 and 2028, and inside the through-hole 2022 of the conductor 1706. In one aspect, FIG. 20B is provided to illustrate the relative positioning of the magnetic field sensing elements of each of the current sensors 1704 relative to the current sensor's 1704 respective conductor 1706. In another aspect, FIG. 20B illustrates that the magnetic field sensing elements 1752 and 1754 in each of the current sensors 1706 may be disposed on opposite sides of the axis Q-Q. In the present example, the axis Q-Q runs through the center of the aperture 1703 and the aperture 1703 is fully symmetrical with respect to the axis QQ.

In another aspect, each of conductors 1706 may include main surfaces 2026 and 2028 that are parallel to each other and edges 2281, 2283, 2285, and 2287 that are disposed between the main surfaces 2026 and 2028. In some implementations, each of the main surfaces 2026 and 2028 may have a much greater surface area than the edges 2281, 2283, 2285, and 2287. (e.g., 5 times greater, 10 times greater, etc.). In the conductor assembly 1701, a main surface of each of the conductors 1706 is facing a main surface of another one of the conductors 1706. This is in contrast with the system 1200 (shown in FIG. 12) where the edges of conductors 1202A and 1202B are facing each other.

FIG. 21A is perspective view of the conductor assembly 1701. FIG. 21B is a side view of the conductor assembly 1701 when viewed from direction D3. In one implementation, each of the conductors 1706 may be coupled to each other via the dielectric layers 1708. In some implementations, each conductor 1706 may be adhered to its neighboring dielectric layer(s) 1708 via a respective layer of adhesive material (not shown). Although in the example of FIGS. 17-22B, the conductors 1706 are separated by dielectric layers 1708, alternative implementations are possible in which conductors 1706 are separated by air gaps. Stated succinctly, the present disclosure is not limited to any specific way of achieving electrical isolation between the conductors 1706 in conductor assembly 1701.

Figure 22A:
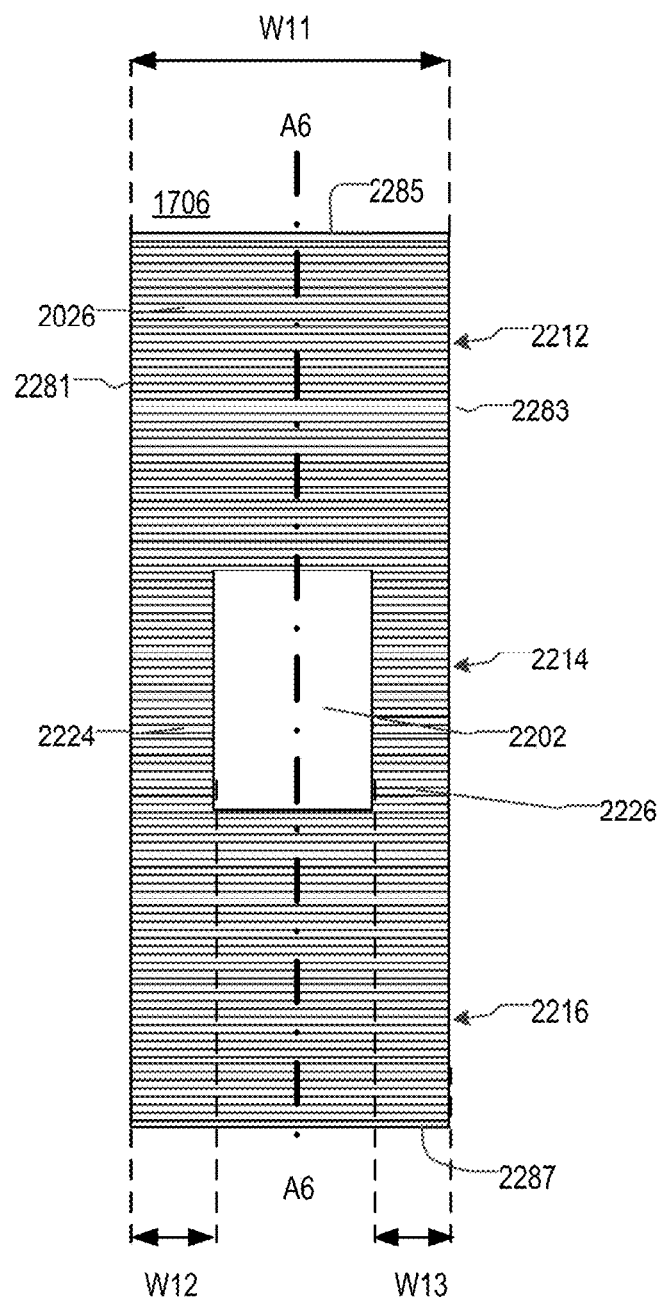
FIG. 22A is a diagram of an example of a conductor, according to aspects of the disclosure.

FIG. 22A is a planar side view of a conductor 1706, according to aspects of the disclosure. As illustrated, conductor 1706 may have a central longitudinal axis A6-A6 that is parallel to the axis A5-A5 (shown in FIG. 17) of the conductor assembly 1701. Furthermore, the conductor 1706 may include portions 2212, 2214, and 2216, with the through-hole 2202 being formed in portion 2214. As illustrated, through-hole 2202 may define legs 2224 and 2226 of the conductor 1706. When a current sensor 1704 is inserted in the through-hole 2202 (as shown in FIG. 20A), the current sensor 1704 may measure the level of electrical current through the legs 2224 and 2226. The conductor 1706 may have width W11. Leg 2224 may have a width W12 that is smaller than the width W11. Leg 2226 may have a width W13 that is smaller than the width W11. According to the present example, width W12 and W13 are equal. However, alternative implementations are possible in which the widths W12 and W13 are different.

Figure 22B:
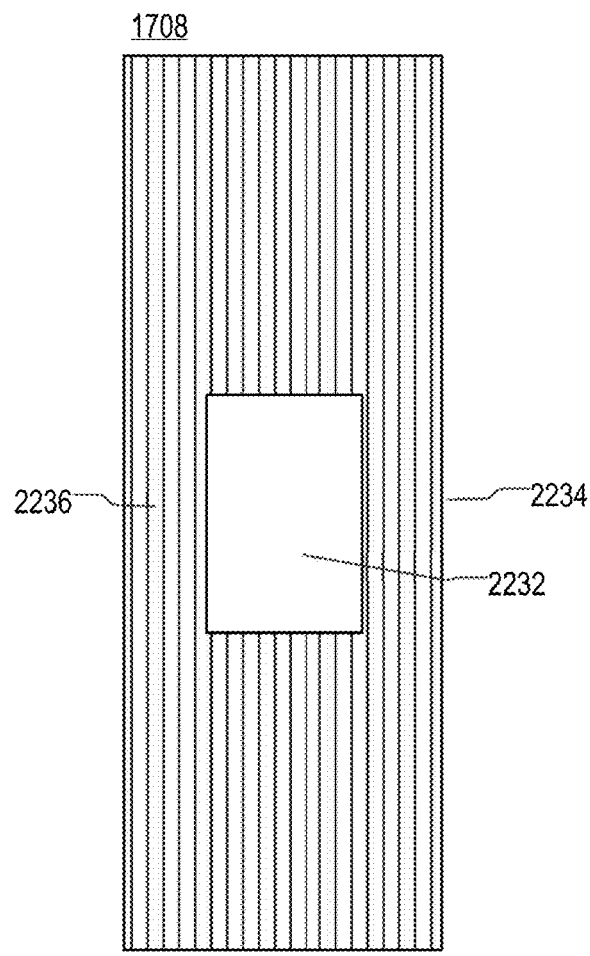
FIG. 22B is a diagram of an example of a dielectric layer, according to aspects of the disclosure.

FIG. 22B is a planar side view of a dielectric layer 1708. As illustrated the dielectric layer 1708 may include a through-hole 2232 that defines legs 2234 and 2236. In one aspect, FIG. 22B illustrates that when a plurality of conductors 1706 are interleaved with a plurality of dielectric layers 1708 to form the conductor assembly 1701, the respective through-hole 2232 of each of the dielectric layers 1708 may be aligned with the respective apertures of the conductors 1706. In another aspect, FIG. 22B illustrates that each dielectric layer 1708 may have the same or similar shape and dimensions as any of the conductors 1706.

Figure 23:
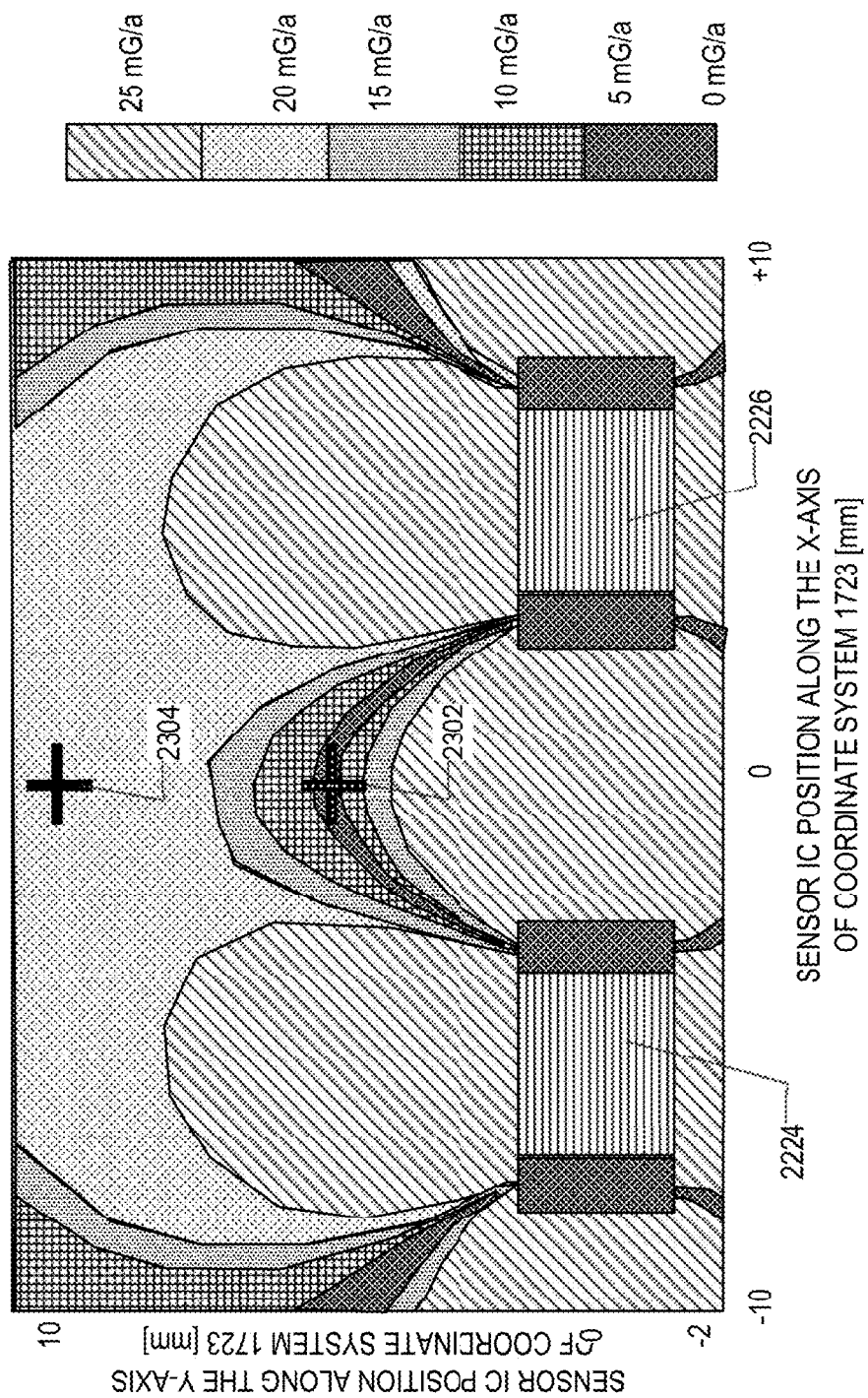
FIG. 23 is a heatmap showing magnetic flux density in the vicinity of a conductor, according to aspects of the disclosure.

FIG. 23 is heatmap showing the magnetic flux density that is produced by a front conductor 1706 in the X-Y plane of the coordinate system 1723. In the present example, the front conductor 1706 is the conductor 1706 that is disposed immediately next to the cross-portion 1804 of printed circuit board 1702 (e.g., see FIG. 17.). The conductor that is disposed the furthest away from the cross-portion 1804, among the conductors 1706 in the conductor assembly 1701, is herein referred to as the "back conductor 1706". The conductor 1706 that is disposed between the back conductor 1706 and the front conductor 1706 is referred to as "the middle conductor 1706". The current sensor 1704 that is disposed inside the through-hole of the front conductor 1706 is herein referred to as "the front current sensor 1704"; the current sensor 1704 that is disposed inside the through-hole of the middle conductor 1706 is herein referred to as "the middle current sensor 1704"; and the current sensor 1704 that is disposed inside the through-hole of the middle conductor 1706 is herein referred to as "the middle current sensor 1704". It will be recalled that the front current sensor 1704 is disposed between legs 2224 and 2226 of the front conductor 1706.

Shown in the heatmap are the locations of legs 2224 and 2226 of the front conductor 1706. Marker 2302 marks the location of the middle current sensor 1704. Marker 2304 marker the location of the furthest current sensor 1704. FIG. 23 shows that the configuration discussed with respect to FIGS. 17-24B is advantageous because it results in zero (or almost zero) cross-talk between the front conductor 1706 and the middle current sensor 1704 (because the magnetic field originating from the front conductor 1706 is near zero at the location of marker 2302). In another aspect, FIG. 23 also shows that the configuration discussed with respect to FIGS. 17-24 results in non-zero cross-talk between the front conductor 1706 and the back current sensor 1704. In this regard, it will be understood that the configuration discussed with respect to FIGS. 17-24 is even better suited for applications that use two conductors only, such as DC-link applications, etc. As discussed above with respect to FIGS. 19A-B, the non-zero crosstalk between the front conductor 1706 and the back current sensor 1704 may be further curtailed by ensuring that the magnetic field sensing elements 1752 and 1754 in the back current sensor 1704 are equidistant from the front conductor 1706 (e.g., by aligning the magnetic field sensing elements 1752 and 1754 with an axis D-D, etc.).

FIG. 24A is a perspective view of an alternative implementation of the conductor assembly 1701. FIG. 24B is a planar side view of the alternative implementation of conductor when viewed from direction D4. In the example of FIGS. 24A-B, the conductors 1706 are identical (or similar) to the conductor 1202A, which is discussed above with respect to FIG. 12B. FIGS. 24A-B are provided to illustrate that the present disclosure is not limited to the conductors 1706 having the shape shown in FIG. 22A. In this regard, it will be understood that each of conductors 1706 may have any of the shapes or configurations that are discussed above with respect to FIGS. 12A-16.

In another aspect, FIGS. 24A-B illustrate that when the conductors 1706 have notches, the notches may be aligned as well. According to the example of FIGS. 24A-B, a plurality of notches are aligned when a straight line, such as the line 2410, can pass through the interior of each of the notches without intersecting any of the conductors 1706. In the example of FIGS. 24A,-B the conductor assembly 1701 includes an aperture 2402 and an aperture 2404. Aperture 2402 is formed by aligning respective first notches of the conductors 1706. Aperture 2404 is formed by aligning respective second notches of the conductors 1706. By way of example, each of the first notches may correspond to notch 1208A (shown in FIG. 12B) and each of the second notches may correspond to notch 1206A (also shown in FIG. 12B).

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A system, comprising:
a printed circuit board;
a first conductor having a first central longitudinal axis, the first conductor having a first notch and a second notch;
a second conductor having a second central longitudinal axis; and
a first current sensor that is mounted on the printed circuit board, the first current sensor being disposed at least partially inside the first notch, the first current sensor including a first pair of magnetic field sensing elements, the magnetic field sensing elements in the first pair being aligned with a first alignment axis,
wherein the first conductor has a flat shape;
wherein the first notch defines a first portion of the first conductor, a second portion of the first conductor, and a third portion of the first conductor, the second portion of the first conductor being disposed between the first portion and the third portion, the second portion having a smaller width than the first portion and the second portion,
wherein the first current sensor is disposed between the first portion and the second portion and to the side of the second portion, and
wherein the first portion, the second portion, the third portion, and the magnetic field sensing elements are disposed in a same plane.

2. The system of claim 1, wherein the first current sensor is disposed on one side of a median axis of the first notch.

3. The system of claim 1, wherein the first current sensor is disposed on a median axis of the first notch.

4. The system of claim 1, wherein the first alignment axis is substantially parallel to the second central longitudinal axis.

5. The system of claim 1, wherein the first alignment axis is arranged at an angle relative to the second central longitudinal axis, the angle being substantially equal to 45 degrees.

6. The system of claim 1, wherein the first alignment axis is arranged at an angle relative to the second central longitudinal axis, the angle being in a range of 30-75 degrees.

7. The system of claim 1, wherein the first central longitudinal axis is parallel to the second central longitudinal axis.

8. The system of claim 1, wherein the second conductor includes a third notch and a fourth notch, the system further comprising a second current sensor that is mounted on the printed circuit board, the second current sensor being disposed at least partially inside the third notch.

9. A system, comprising:
a first conductor having a first central longitudinal axis, the first conductor having a first through-hole that is formed therein, the first through-hole being formed in a first primary surface of the first conductor;

a second conductor that is disposed adjacent to the first conductor, the second conductor having a second central longitudinal axis, the second conductor having a second through-hole that is formed therein, the second through-hole being formed in a second primary surface of the second conductor, the second primary surface of the second conductor being arranged to face the first primary surface of the first conductor;

a layer of dielectric material that is formed in a space between the first primary surface and the second primary surface, the layer of dielectric material being configured to couple the first primary surface of the first conductor to the second primary surface of the second conductor, such that the first primary surface of the first conductor is coupled to a first side of the layer of dielectric material and the second primary surface of the second conductor is coupled to a second side of the layer of dielectric material; and a printed circuit board that is inserted through the first through-hole and the second through-hole, the printed circuit board having a first current sensor and a second current sensor mounted thereon.

10. The system of claim 9, wherein:

the first current sensor is disposed inside the first through-hole and includes a first pair of magnetic field sensing elements, the magnetic field sensing elements in the first pair having respective axes of maximum sensitivity that are substantially perpendicular to the first central longitudinal axis, the second current sensor is disposed inside the second through-hole and includes a second pair of magnetic field sensing elements, the magnetic field sensing elements in the second pair having respective axes of maximum sensitivity that are substantially perpendicular to the second central longitudinal axis, and the magnetic field sensing elements in the first pair are disposed on opposite sides of the first central longitudinal axis and the magnetic field sensing elements in the second pair are disposed on opposite sides of the second central longitudinal axis.

11. The System of claim 9, wherein:

the first current sensor is disposed inside the first through-hole and includes a first pair of magnetic field sensing elements, the magnetic field sensing elements in the first pair having respective axes of maximum sensitivity that are substantially perpendicular to the first central longitudinal axis, and the second current sensor is disposed inside the second through-hole and includes a second pair of magnetic field sensing elements, the magnetic field sensing elements in the second pair having respective axes of maximum sensitivity that are substantially perpendicular to the second central longitudinal axis.

12. The system of claim 9, wherein the printed circuit board includes a connector having a plurality of first terminals each of the first terminals being coupled to a respective second terminal in one of the first current sensor and the second current sensor via a respective conductive trace that is part of the printed circuit board.

13. The system of claim 9, wherein:

the first conductor includes a first pair of notches that are formed on opposite sides of the first through-hole, and the second conductor includes a second pair of notches that are formed on opposite sides of the second through-hole, each of the notches in the second pair being aligned with a respective one of the notches from the first pair.

14. The system of claim 9, wherein the printed circuit board is T-shaped.

15. The system of claim 9, wherein the printed circuit board includes a first portion and a second portion that is transverse to the second portion, the first and second current sensor are mounted on the first portion, and the second portion is arranged to engage the first conductor when the first current sensor is situated in the first through-hole and the second current sensor is situated in the second through-hole.

16. A system, comprising:

a printed circuit board;

a conductor having a pair of notches formed therein that define a mid-portion of the conductor, the mid-portion being disposed between a first end portion and a second end portion of the conductor, the mid portion extending along an axis T-T that is arranged at a first angle relative to a central longitudinal axis A3-A3, the first angle being less than 75 degrees; and a current sensor that is mounted on the printed circuit board, the current sensor being disposed at least partially inside a through-hole in the conductor, the current sensor including a pair of magnetic field sensing elements that are aligned with an axis G-G, the axis G-G being arranged at a second angle relative to the central longitudinal axis A3-A3, the second angle being less than 75 degrees.

17. The system of claim 16, wherein each of the notches in the pair is shaped as a triangle.

* * * * *